(12) United States Patent
Xie et al.

(10) Patent No.: US 9,059,042 B2
(45) Date of Patent: Jun. 16, 2015

(54) METHODS OF FORMING REPLACEMENT GATE STRUCTURES AND FINS ON FINFET DEVICES AND THE RESULTING DEVICES

(71) Applicant: GLOBALFOUNDRIES Inc., Grand Cayman (KY)

(72) Inventors: Ruilong Xie, Niskayuna, NY (US); Ajey Poovannummoottil Jacob, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/078,979

(22) Filed: Nov. 13, 2013

(65) Prior Publication Data

US 2015/0129962 A1    May 14, 2015

(51) Int. Cl.
*H01L 21/84* (2006.01)
*H01L 27/12* (2006.01)
*H01L 29/66* (2006.01)
*H01L 29/423* (2006.01)
*H01L 27/092* (2006.01)

(52) U.S. Cl.
CPC ...... *H01L 27/1211* (2013.01); *H01L 29/42372* (2013.01); *H01L 21/845* (2013.01); *H01L 29/66795* (2013.01); *H01L 29/66787* (2013.01); *H01L 27/0924* (2013.01)

(58) Field of Classification Search
CPC .............. H01L 21/845; H01L 27/1211; H01L 27/0924; H01L 29/66795; H01L 29/66787
See application file for complete search history.

(56) References Cited

U.S. PATENT DOCUMENTS

| | | | |
|---|---|---|---|
| 8,580,634 B1* | 11/2013 | Xie et al. | 438/212 |
| 2014/0291760 A1* | 10/2014 | Cheng et al. | 257/347 |
| 2014/0377917 A1* | 12/2014 | He et al. | 438/157 |

* cited by examiner

*Primary Examiner* — Phat X Cao
(74) *Attorney, Agent, or Firm* — Amerson Law Firm, PLLC

(57) ABSTRACT

One method disclosed includes, among other things, removing a sacrificial gate structure to thereby define a replacement gate cavity, performing an etching process through the replacement gate cavity to define a fin structure in a layer of semiconductor material using a patterned hard mask exposed within the replacement gate cavity as an etch mask and forming a replacement gate structure in the replacement gate cavity around at least a portion of the fin structure.

9 Claims, 29 Drawing Sheets

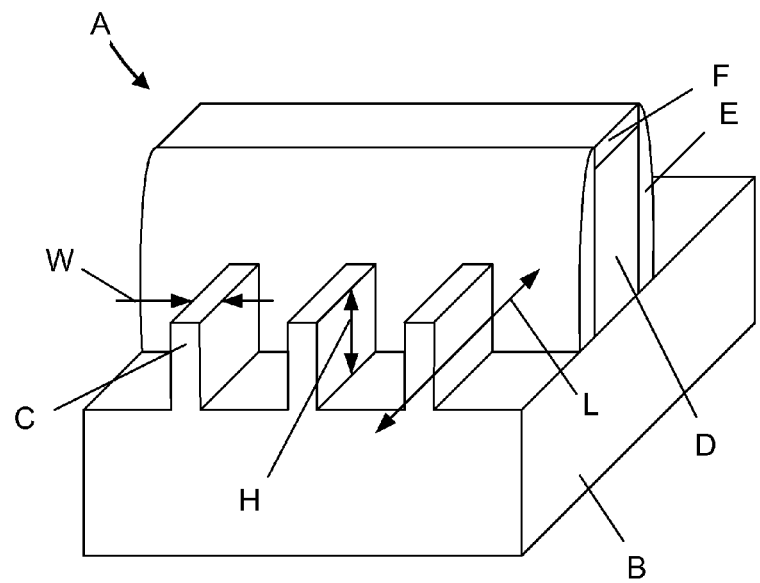
Figure 1A (Prior Art)
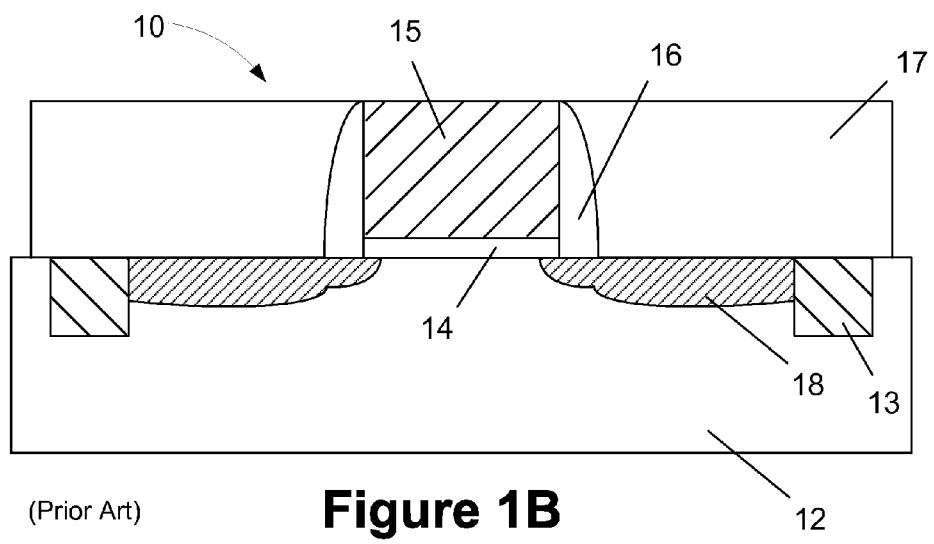
(Prior Art) Figure 1B

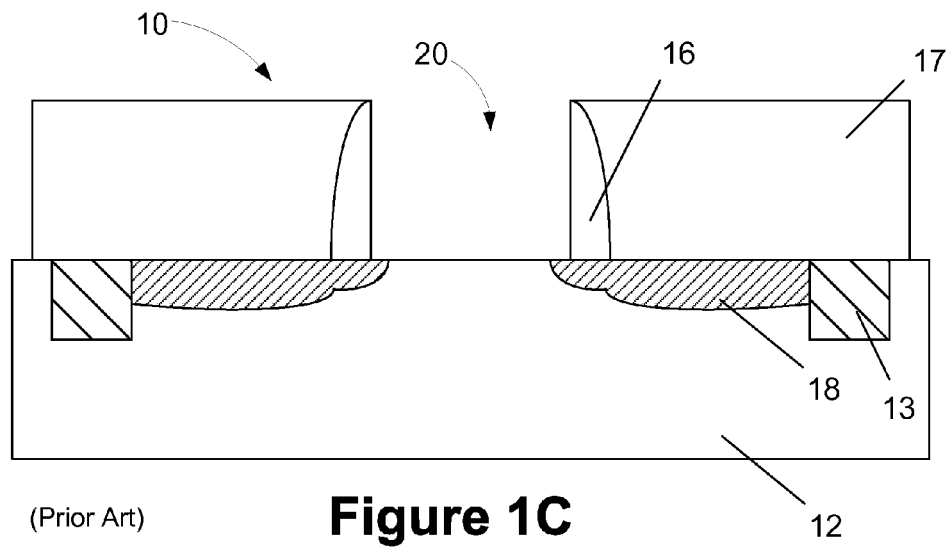
(Prior Art) Figure 1C
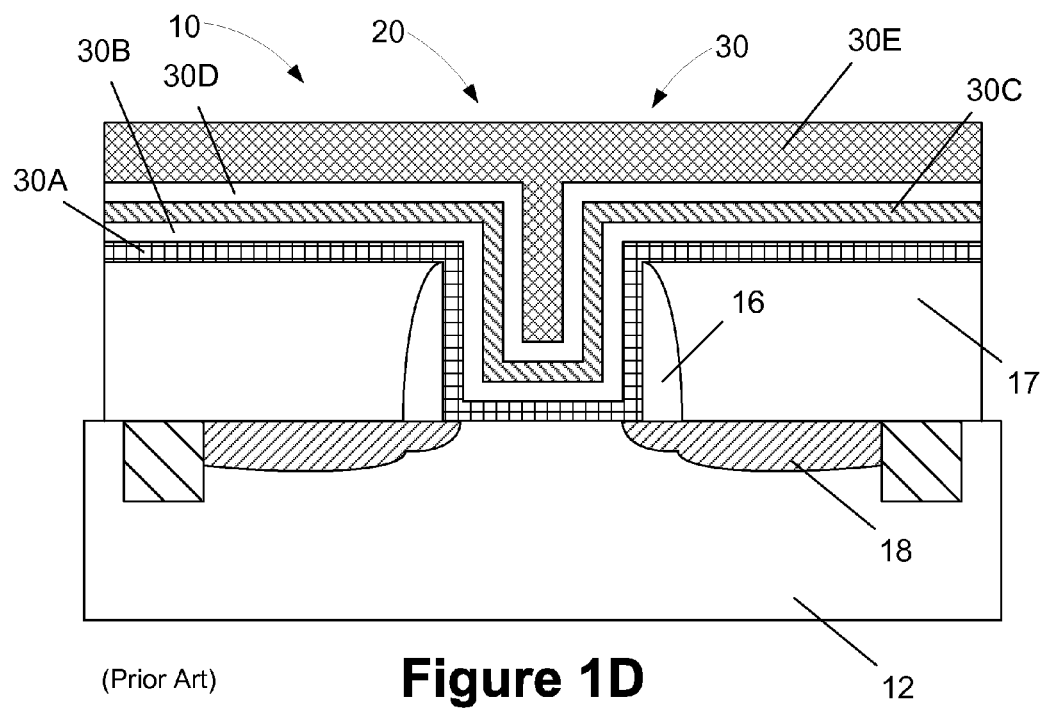
(Prior Art) Figure 1D

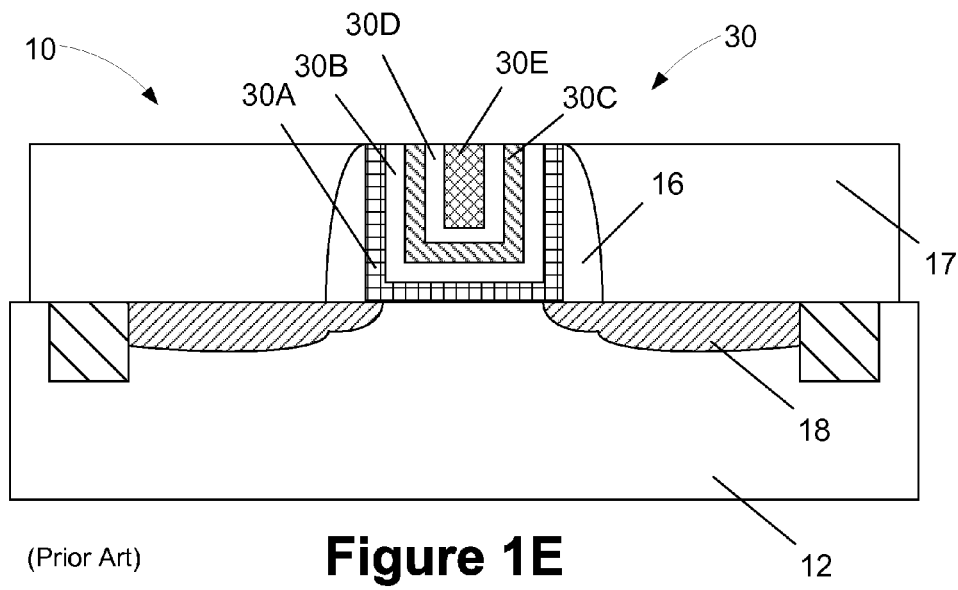
(Prior Art) Figure 1E
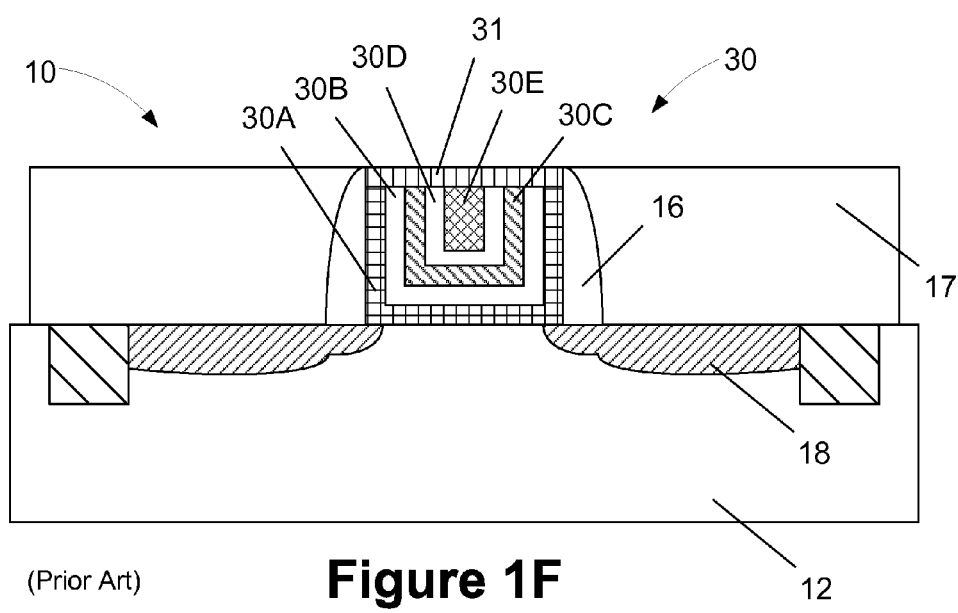
(Prior Art) Figure 1F

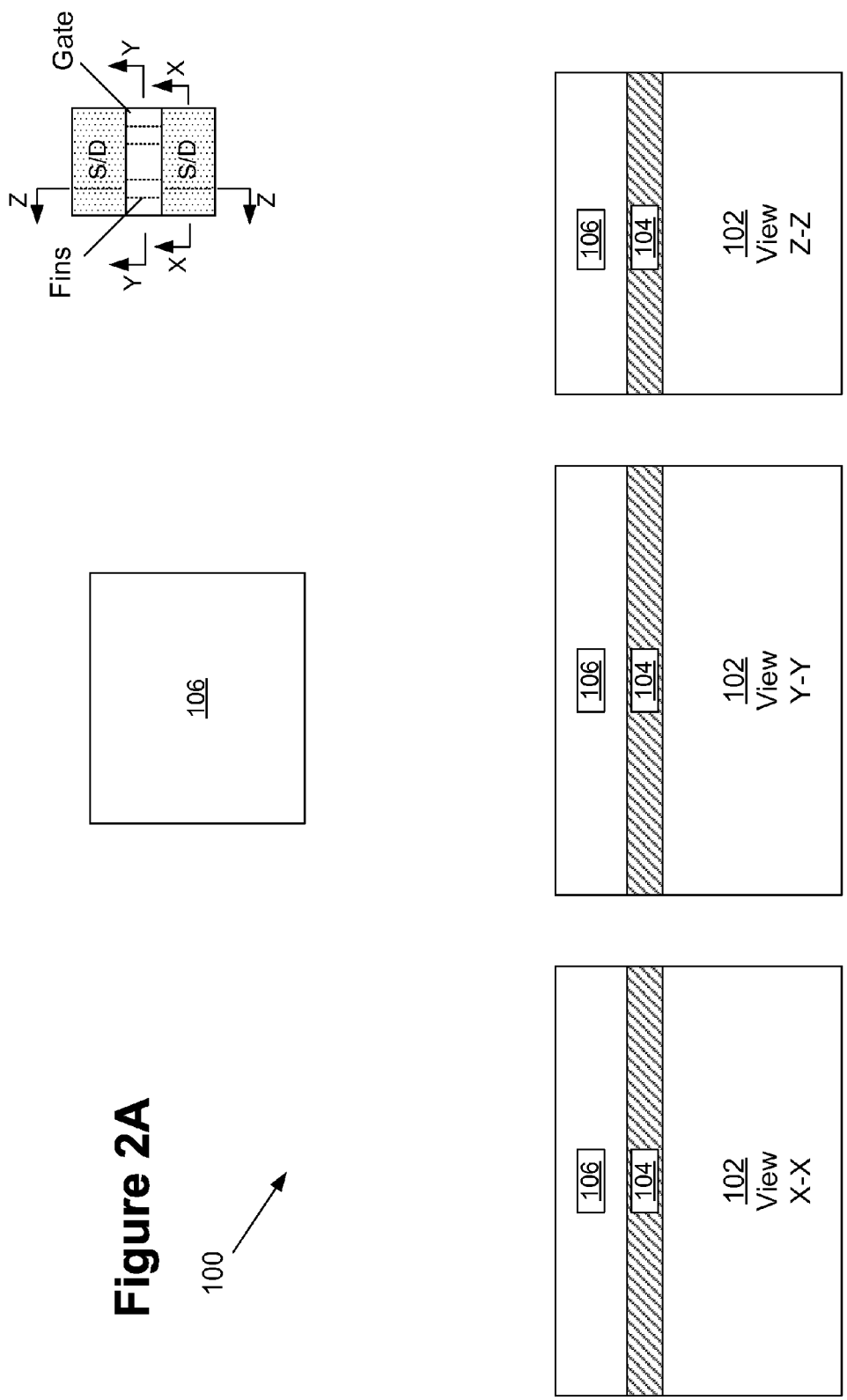

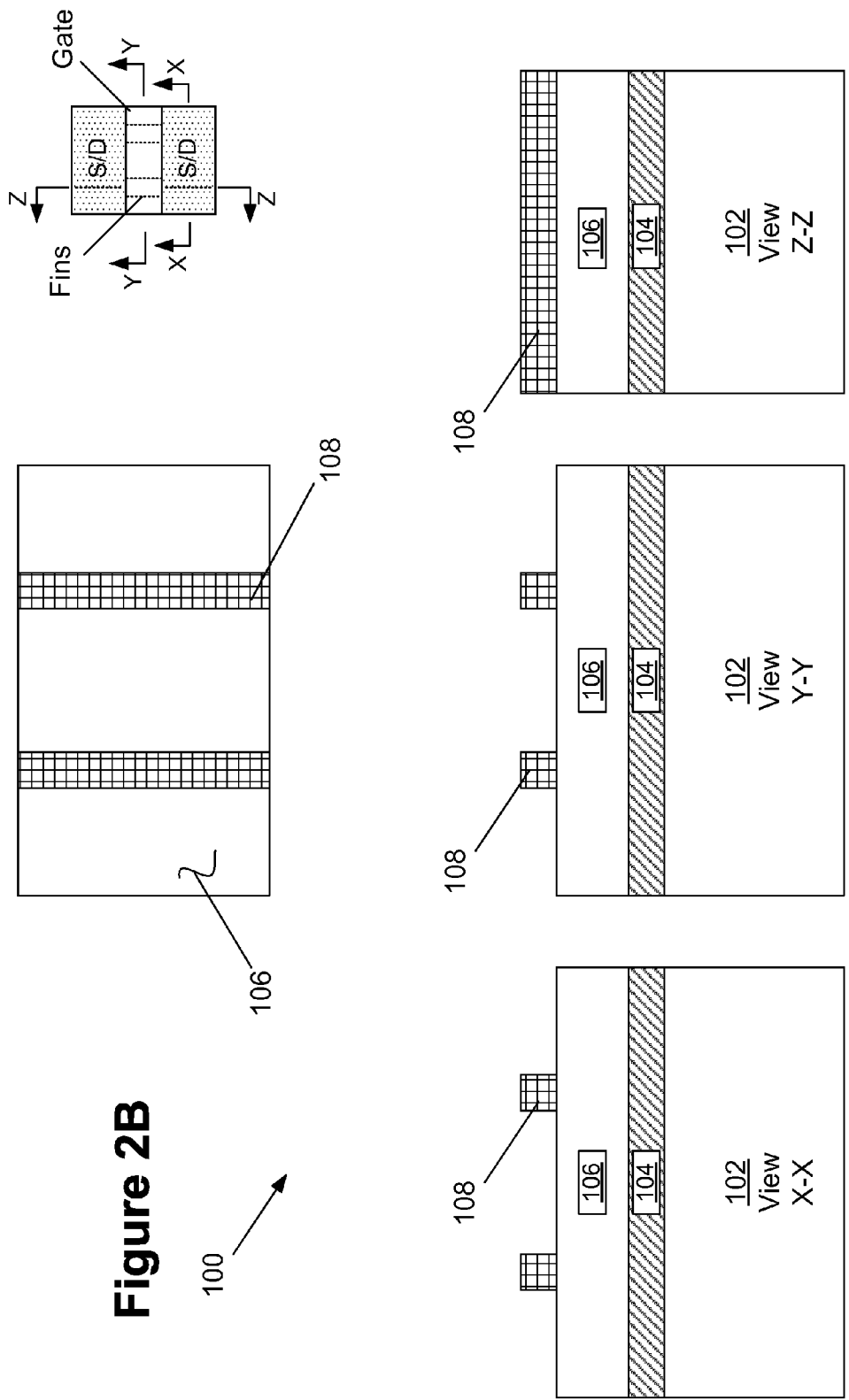

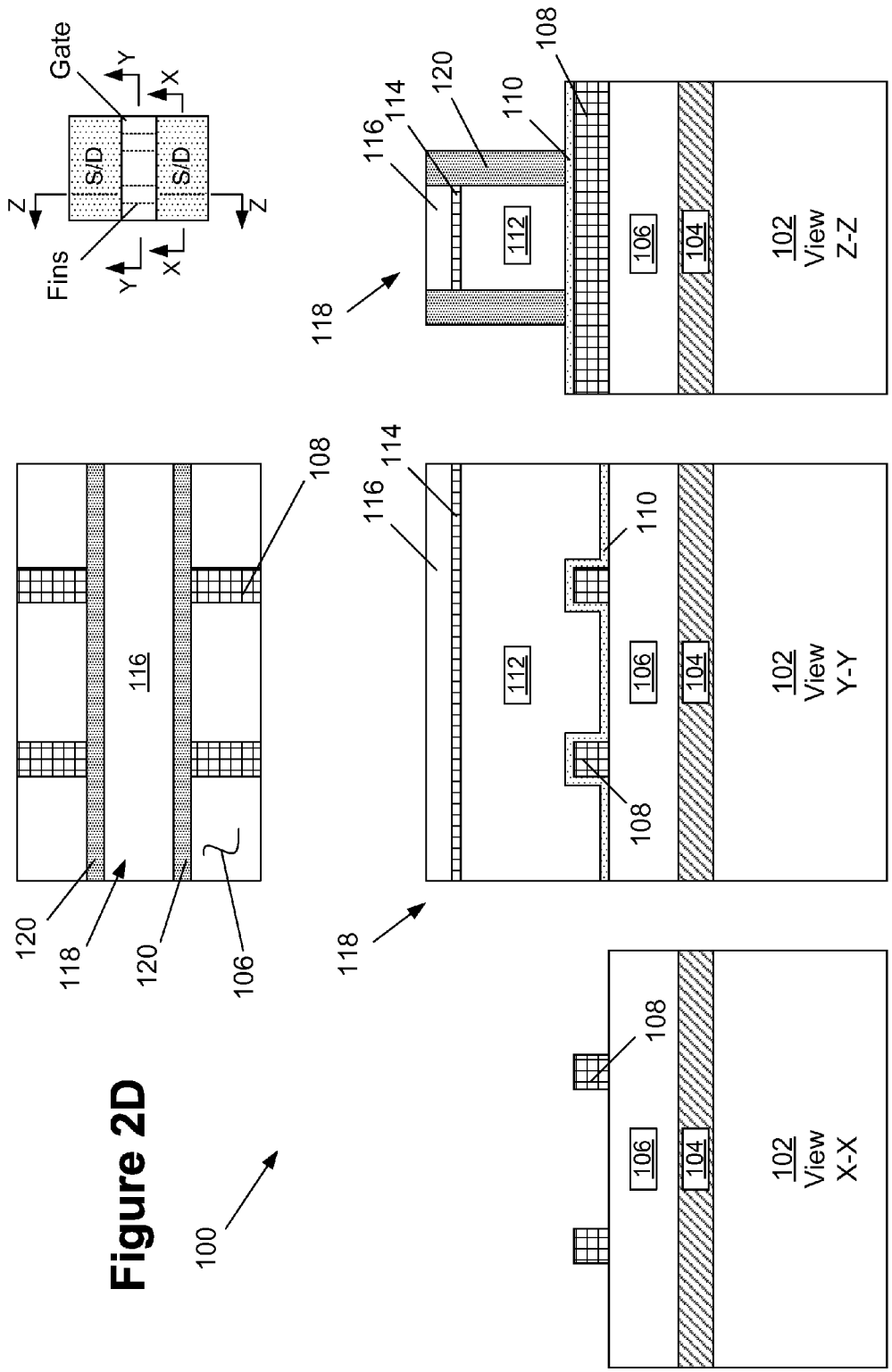

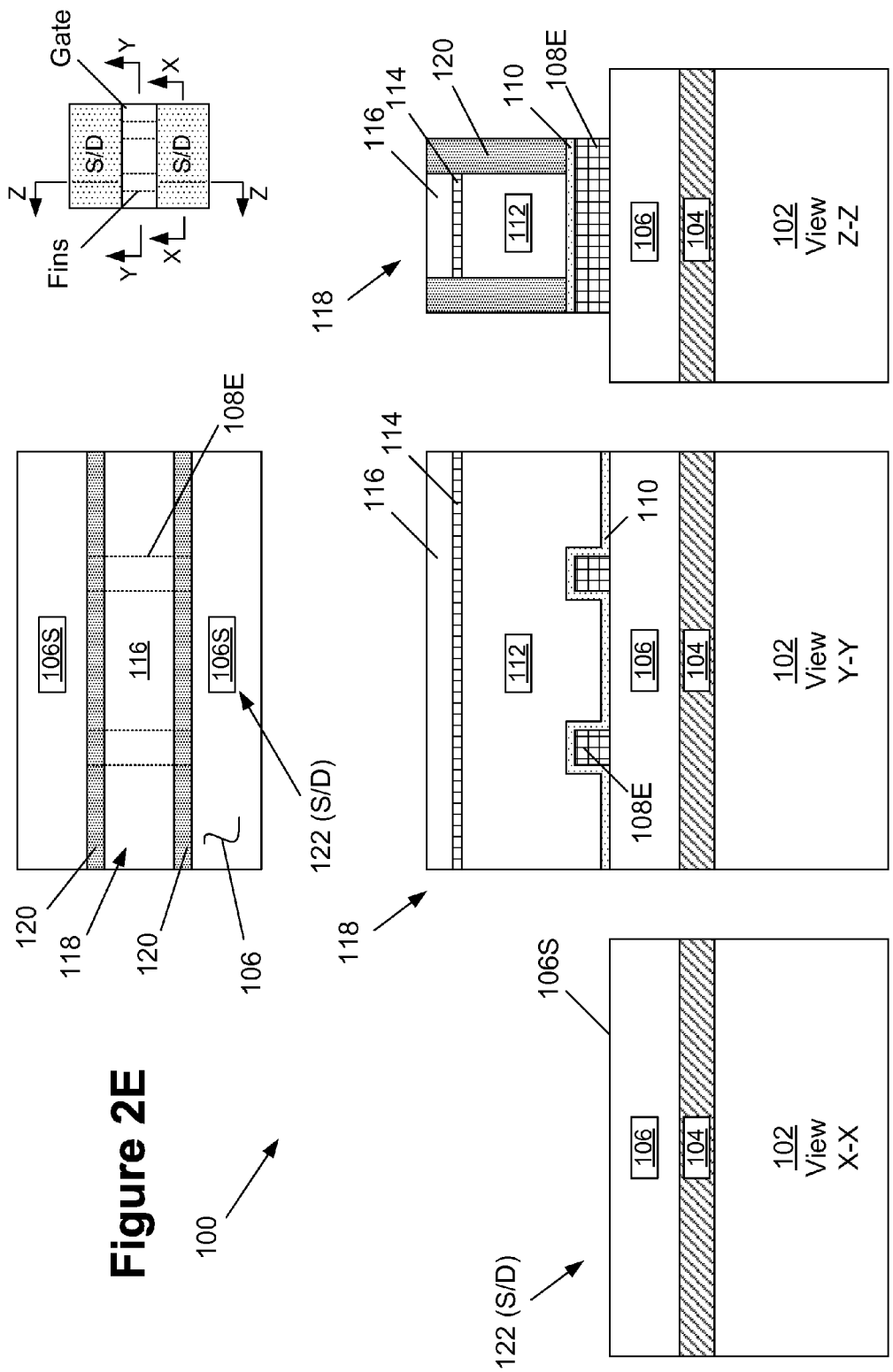

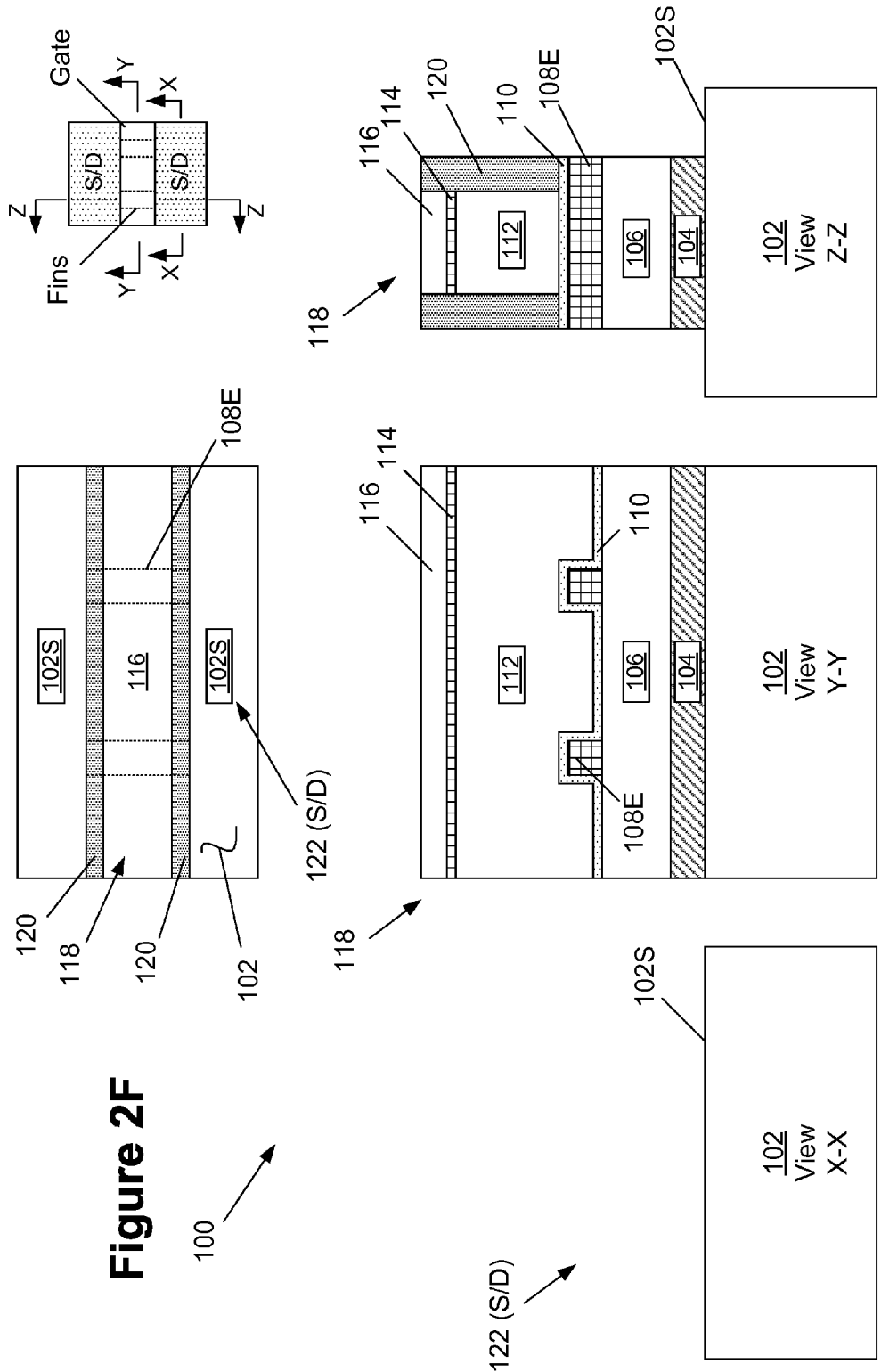

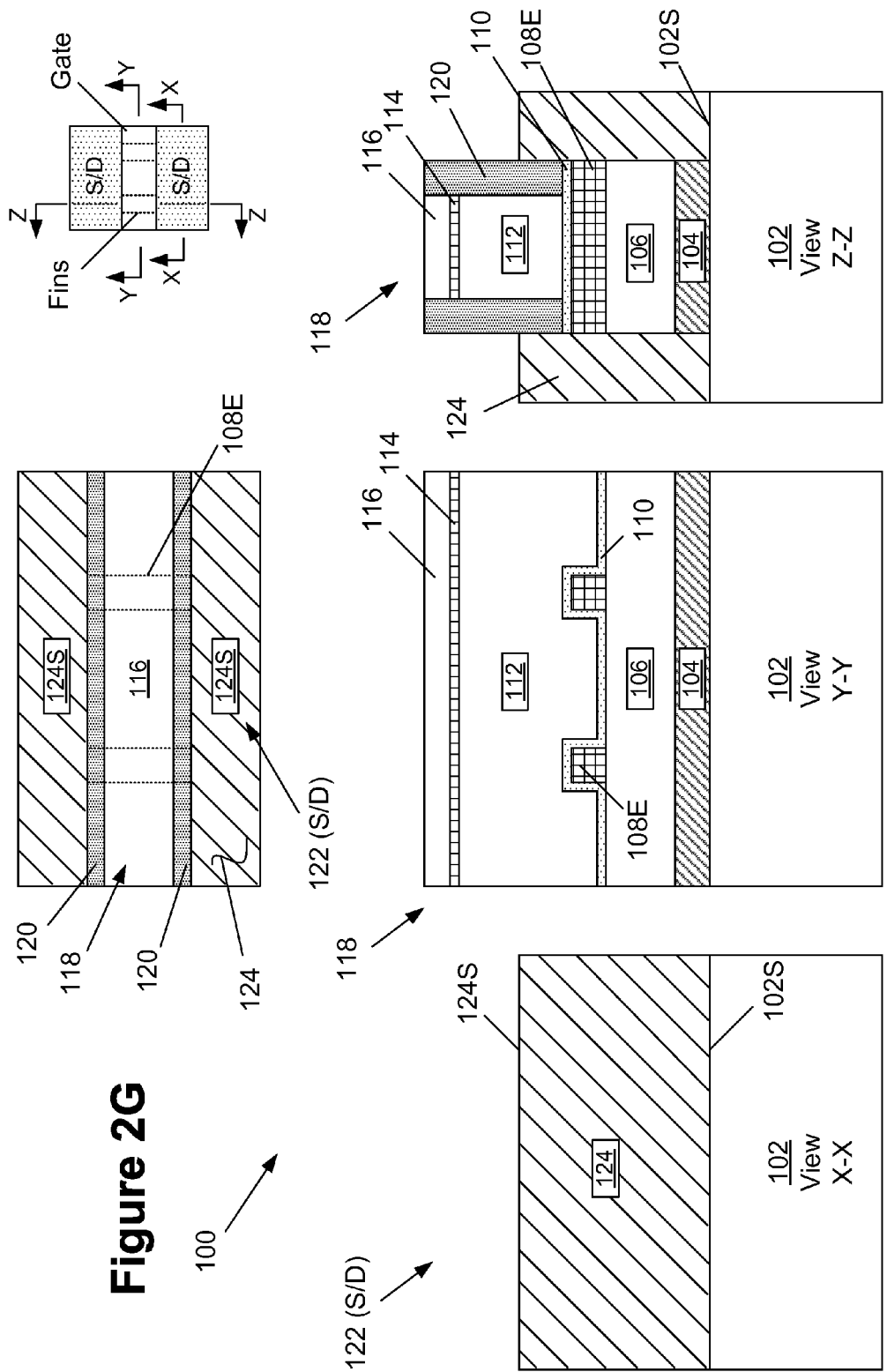

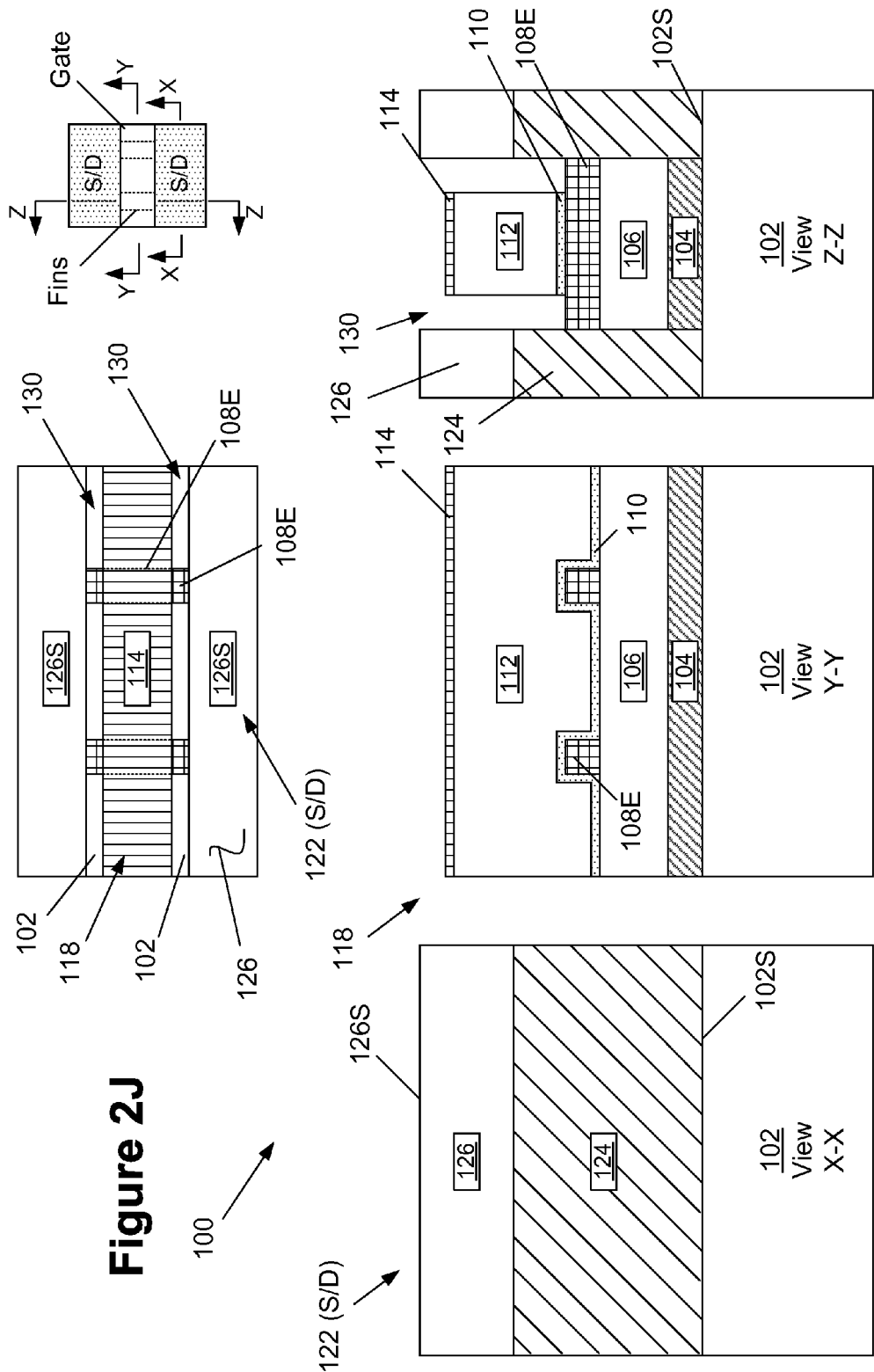

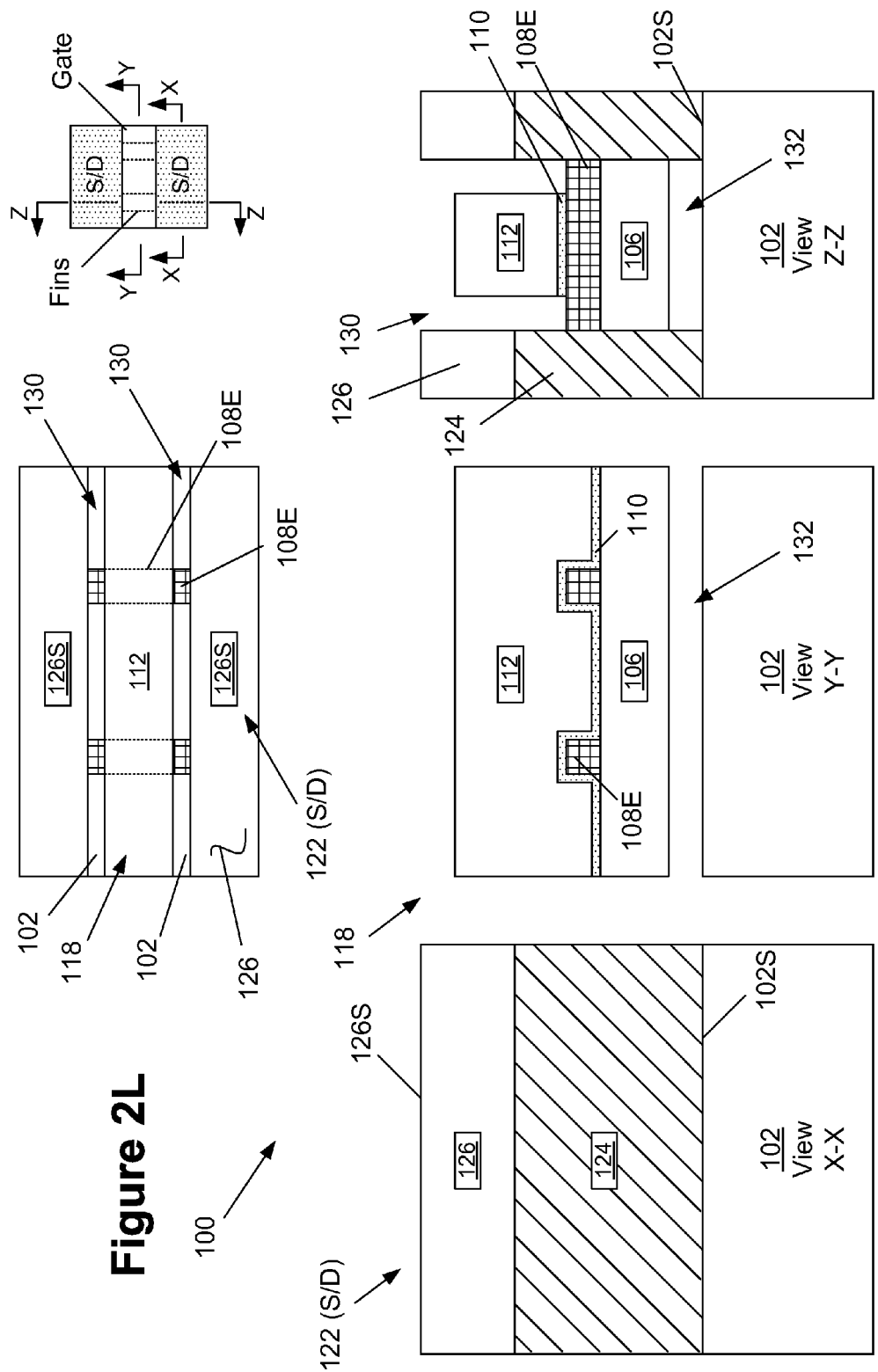

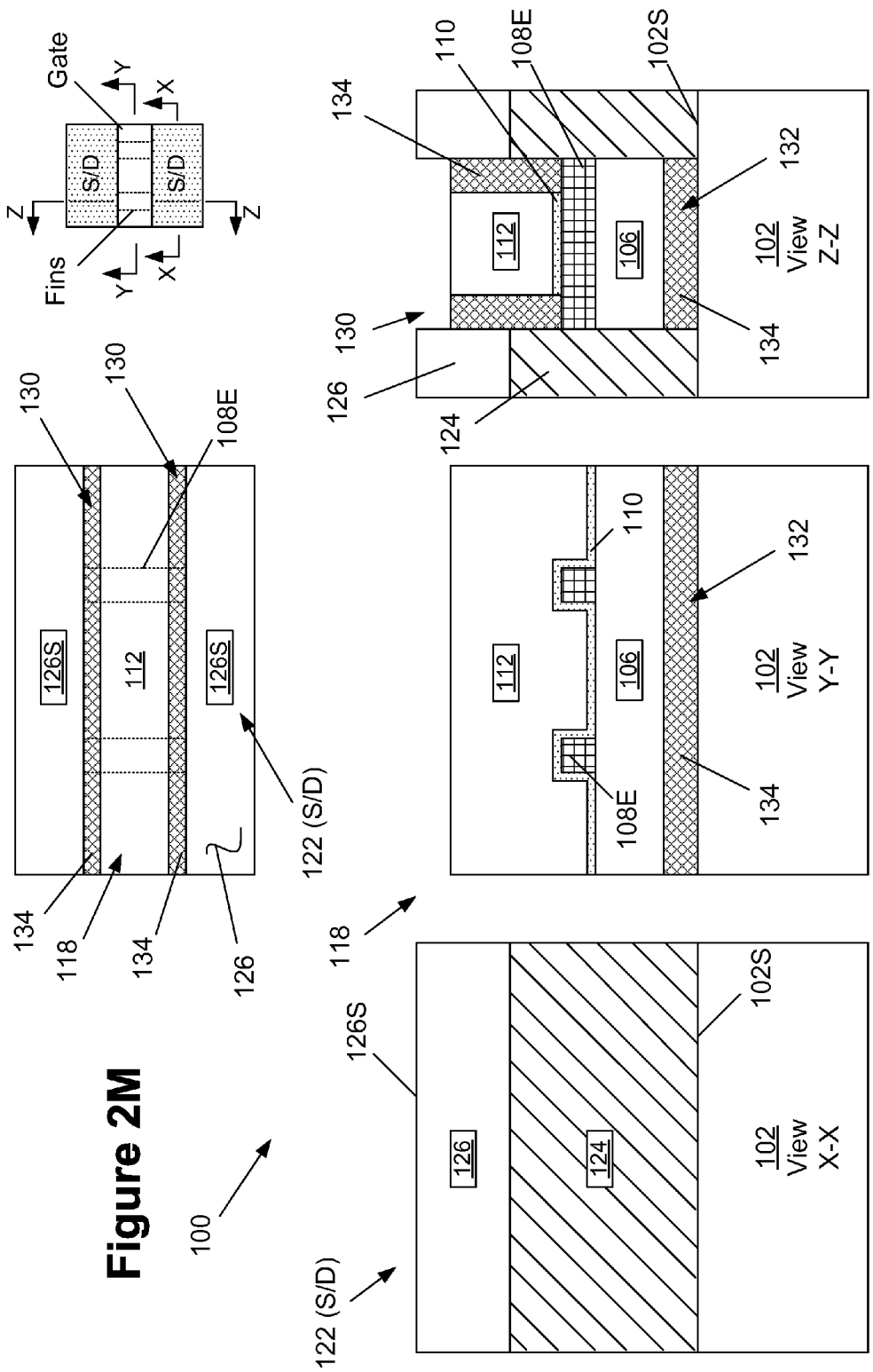

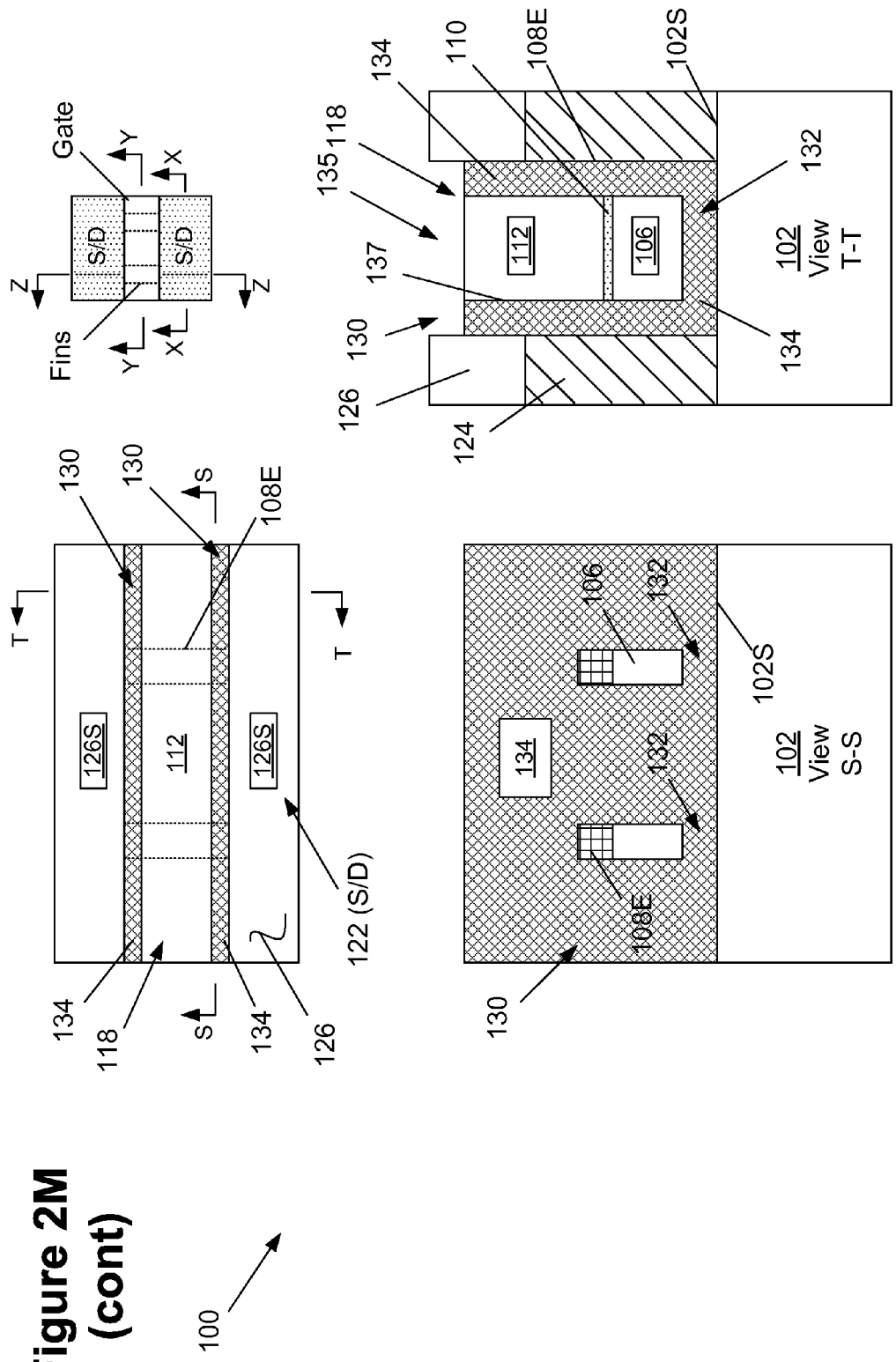

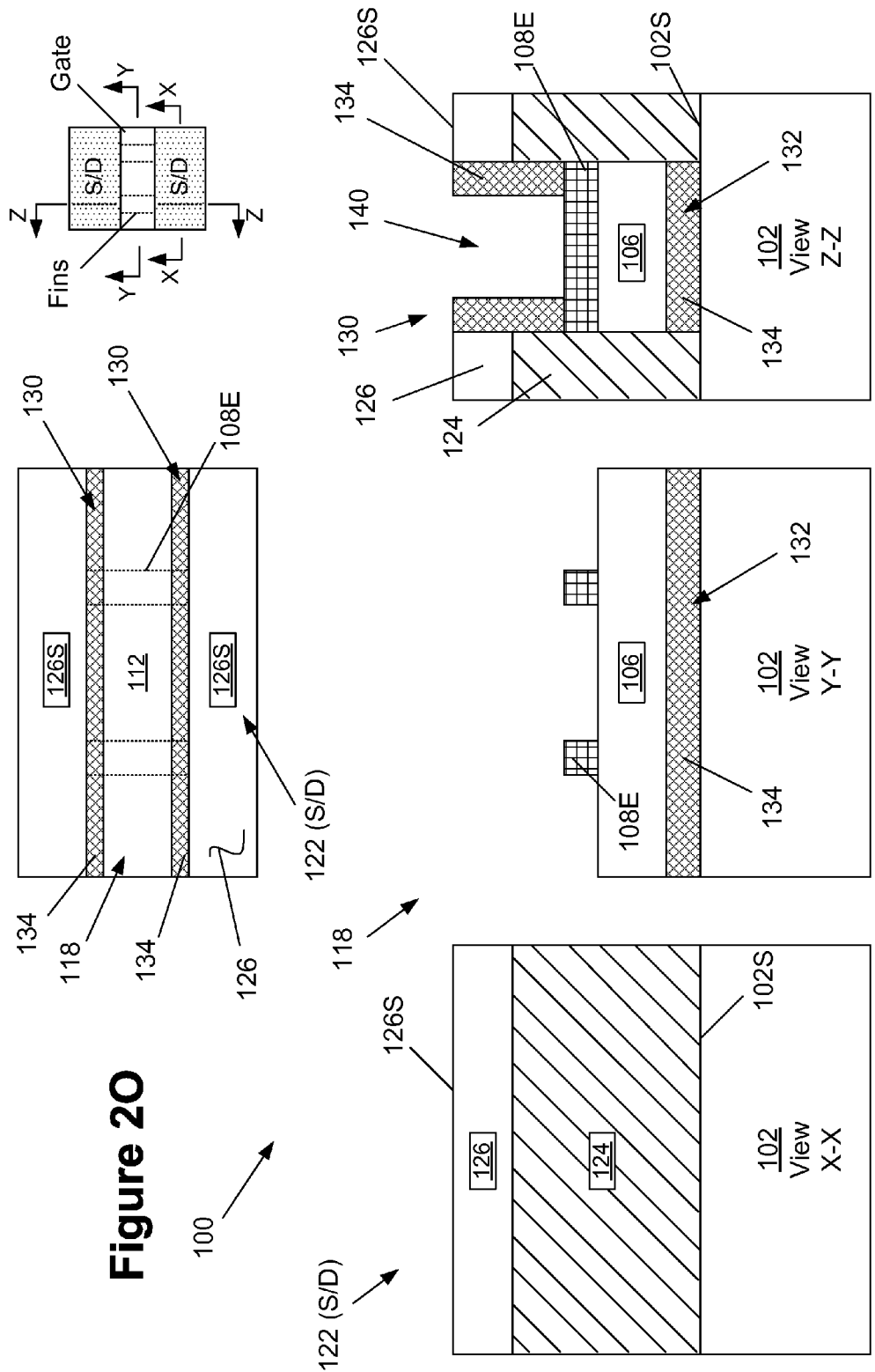

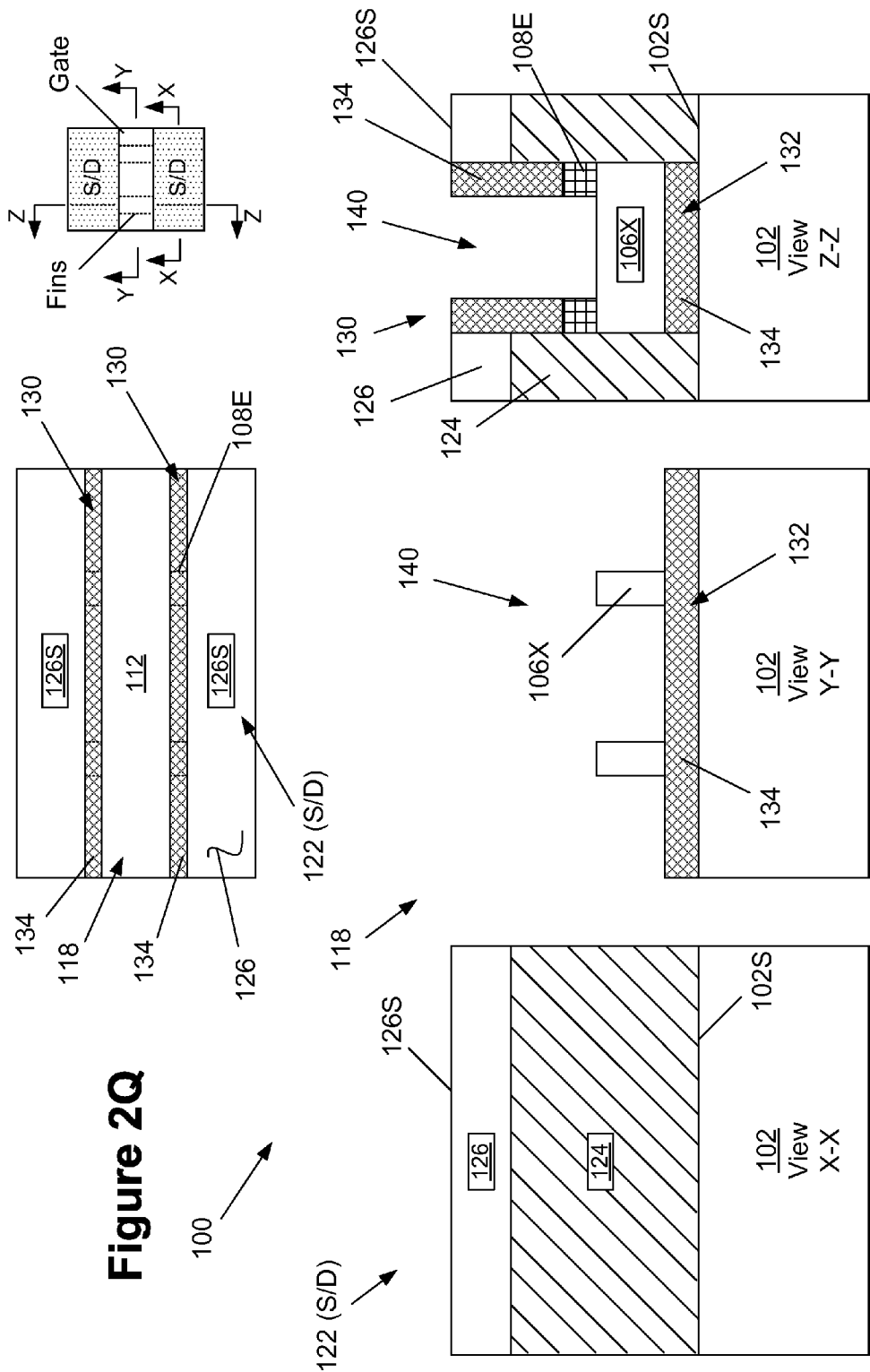

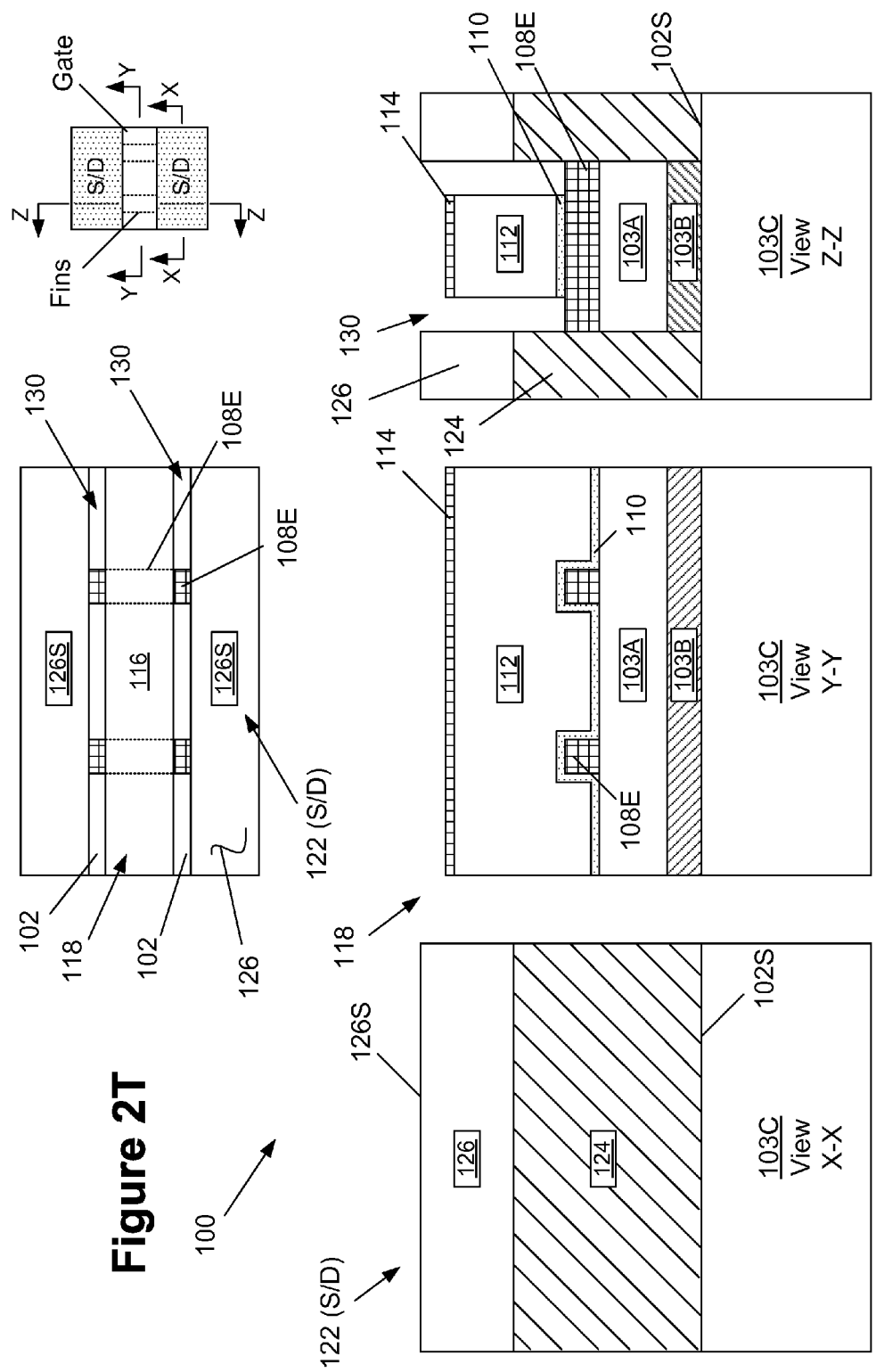

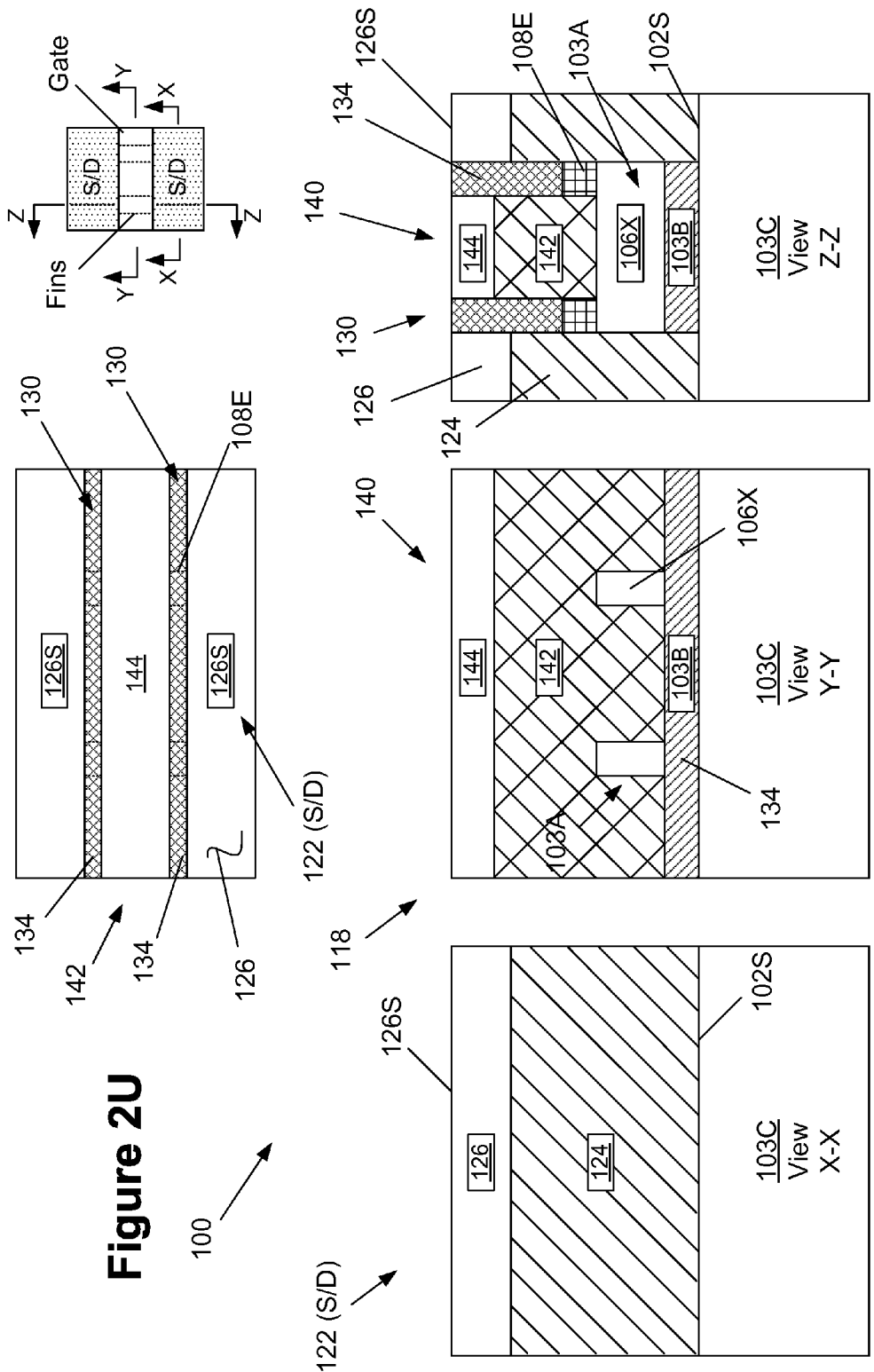

US 9,059,042 B2

METHODS OF FORMING REPLACEMENT GATE STRUCTURES AND FINS ON FINFET DEVICES AND THE RESULTING DEVICES

BACKGROUND OF THE INVENTION

1. Field of the Invention

The present disclosure generally relates to the fabrication of integrated circuits, and, more particularly, to various methods of forming replacement gate structures and fins on FinFET semiconductor devices and the resulting semiconductor devices.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1 A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2x) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconductor substrate 12 in an active area defined by a shallow trench isolation structure 13. At the point of fabrication depicted in FIG. 1B, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more recess etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

One problem that is encountered in forming FinFET devices relates to preventing leakage currents underneath the fin structures. This is sometimes referred to as so-called "punch through" leakage currents. One prior art effort to eliminate or reduce such undesirable punch through leakage currents involved forming counter-doped regions that were positioned at approximately the intersection between the fin and the remaining portion of the substrate. Designers continue to search for various methods of fabricating FinFET devices to address this and other issues.

Another problem involved in forming FinFET devices is related to the formation of the spacer and the source/drain regions. The presence of fins in the source/drain regions increases the difficulty of etching the spacer and also makes it challenging to form contacts to the fins. Thus, an epi semiconductor material is typically formed on the fins in the source/drain regions to facilitate contact formation. In contrast, source/drain regions in conventional planar devices can just be formed by performing simple implantation processes and contacts can be readily made to the substantially planar source/drain regions. In general, it would be desirable to only form fin structures in the channel region of a FinFET device while the source/drain regions of such a FinFET device would be substantially planar.

The present disclosure is directed to various methods of forming replacement gate structures and fins on FinFET semiconductor devices and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement gate structures and fins on FinFET semiconductor devices and the resulting semiconductor devices. One method disclosed includes, among other things, forming a patterned hard mask above a layer of semiconductor material, forming a sacrificial gate structure above the patterned hard mask and the layer of semiconductor material, forming a first sidewall spacer adjacent the sacrificial gate structure, forming a layer of insulating material adjacent the first sidewall spacers, performing at least one first etching process to remove the first sidewall spacers and thereby define a spacer cavity between the layer of insulating material and the sacrificial gate structure, substantially filling at least the spacer cavity with an insulating material so as to define at least a second sidewall spacer in the spacer cavity, performing at least one second etching process to remove the sacrificial gate structure and thereby define a replacement gate cavity positioned between the second sidewall spacers, performing at least one etching process through the replacement gate cavity to define the fin structure in the layer of semiconductor material using the patterned hard mask exposed within the replacement gate cavity as an etch mask, and forming a replacement gate structure in the replacement gate cavity around at least a portion of the fin structure.

One illustrative device disclosed herein includes, among other things, a fin structure comprised of a semiconductor material, a substantially U-shaped insulating material structure comprised of one or more layers of insulating material, wherein the substantially U-shaped insulating material defines a recess between spaced-apart vertically oriented legs of the U-shaped insulating material structure, a replacement gate structure positioned in the recess in the substantially U-shaped insulating material structure and around a portion of the fin structure, and a gate cap positioned above the replacement gate structure and within the recess in the substantially U-shaped insulating material structure.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure of a transistor using a so-called "replacement gate" technique.

Figure 2C:
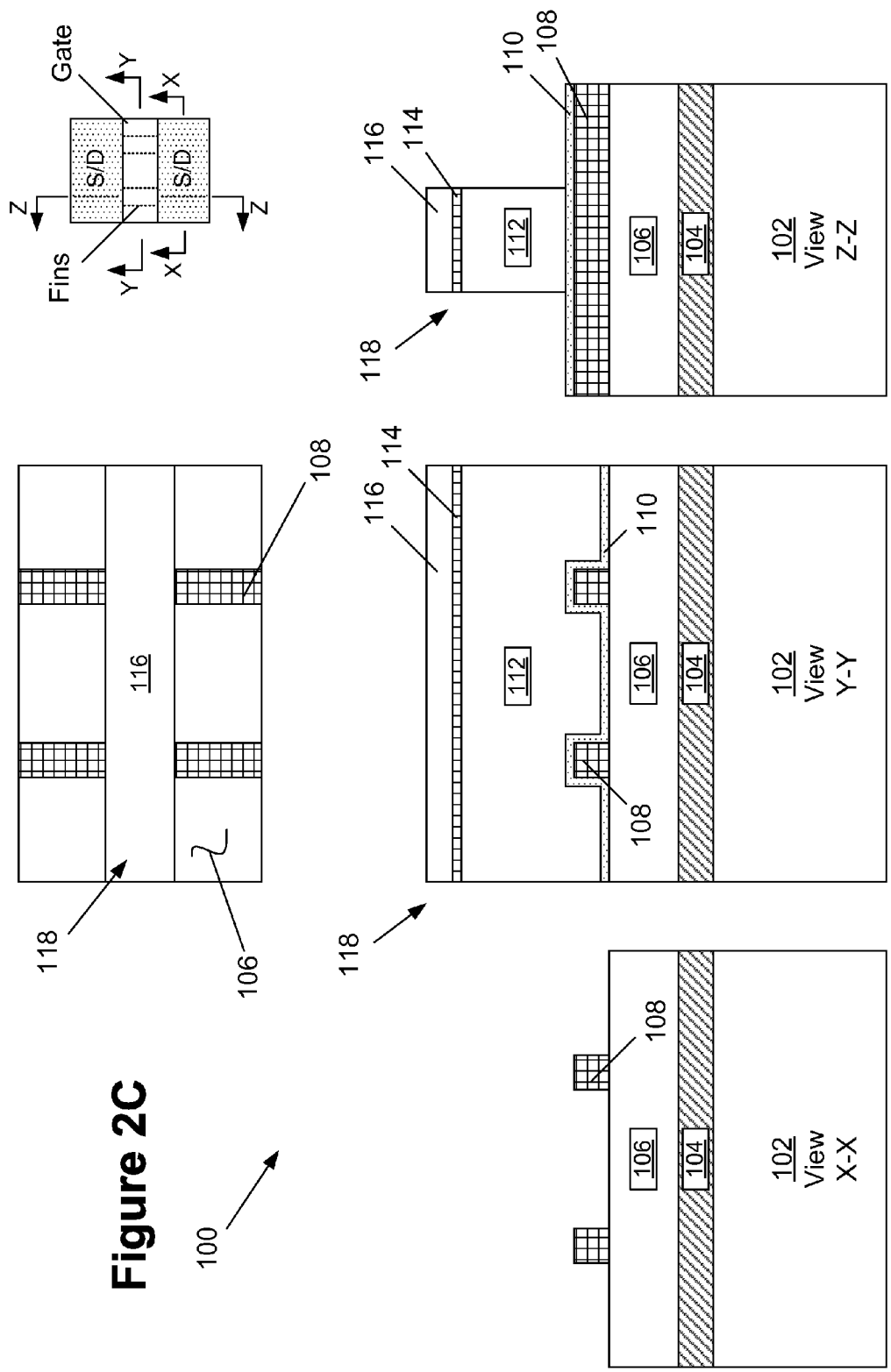
FIGS. 2A-2U depict various illustrative methods disclosed herein of forming replacement gate structures and fins on FinFET semiconductor devices and the resulting semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming replacement gate structures and fins on FinFET semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. Of course, the inventions disclosed herein should not be considered to be limited to the illustrative examples depicted and described herein. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. Additionally, various doped regions, e.g., source/drain regions, halo implant regions, well regions and the like, are not depicted in the attached drawings. The substrate 102 may be made of silicon or it may be made of materials other than silicon. In other embodiments, the device 100 may be formed on a so-called silicon-on-insulator (SOI) substrate, as described more fully below. Thus, the terms "substrate" or "semiconductor substrate" should be understood to cover all semiconducting materials and all forms of such materials.

The attached drawings present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view that is taken through the source/drain (S/D) region of the device (i.e., along the gate width direction of the device 100). The view "Y-Y" is a cross-sectional view that is taken through the gate structure of the device in the gate-width direction. The view Z-Z is a cross-sectional view that is taken through the long axis of the fins 106 of the device (i.e., in the current transport or gate-length direction of the device). The drawings also include a reduced-size plan view of the device 100. Some of the drawings include additional views that will be described below as needed.

FIG. 2A depicts the device 100 at a point in fabrication wherein several process operations have been performed. First, a first layer of epi semiconductor material 104 is deposited on the surface of the bulk semiconductor substrate 102. In one example, the layer of epi semiconductor material 104 may be a layer of silicon/germanium ($Si_xGe_{1-x}$). The thickness of the epi semiconductor material 104 may vary depending upon the particular application. In one illustrative embodiment, the layer of epi semiconductor material 104 may have a thickness of about 5-15 nm. The epi semiconductor material 104 may be formed using any of a variety of different traditional epitaxial deposition processes. Thereafter, a second layer of epi semiconductor material 106 is deposited on the surface of the epi semiconductor material 104. In one example, the layer of epi semiconductor material 106 may be a layer of silicon. The thickness of the epi semiconductor material 106 may vary depending upon the particular application. In one illustrative embodiment, the layer of epi semiconductor material 106 may have a thickness of about 20-45 nm. The epi semiconductor material 106 may be formed using any of a variety of different traditional epitaxial deposition processes.

FIG. 2B depicts the device 100 after a patterned hard mask 108, i.e., a patterned layer of silicon dioxide, has been formed above the device 100. As will become clear after a complete reading of the present application, the patterned hard mask layer 108 will be employed to form an illustrative device 100 having two illustrative fins. However, as will be recognized by those skilled in the art after a complete reading of the present application, the methods and devices disclosed herein may be employed when manufacturing FinFET devices having any number of fins. The patterned hard mask layer 108 may be formed by depositing the hard mask material above the device and performing one or more etching processes through a patterned photoresist mask (not shown) to achieve the desired pattern for the patterned hard mask layer 108.

FIG. 2C depicts the device after several process operations were performed so as to result in the formation of a sacrificial gate structure 118. The sacrificial gate structure 118 includes a sacrificial gate insulation layer 110 and a dummy or sacrificial gate electrode 112. Also depicted is an etch stop layer 114, such as high-k (k value of 10 or greater), e.g., hafnium oxide, and an illustrative gate cap 116. The various components and structures of the device 100 may be formed using a variety of different materials and by performing a variety of known techniques. For example, the sacrificial gate insulation layer 110 may be comprised of silicon dioxide and the sacrificial gate electrode 112 may be comprised of polysilicon or amorphous silicon. The various layers of material depicted in FIG. 2C, as well as the layers of material described below, may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature. The structure depicted in FIG. 2C may be formed by depositing the various layers of material on the device and thereafter performing one or more etching processes through a patterned etch mask (not shown) to remove the exposed portions of the layers of material. The patterned etch mask may then be removed.

FIG. 2D depicts the device 100 after a schematically-depicted sidewall spacer 120 has been formed adjacent the sacrificial gate structure 118. The sidewall spacer 120 may be formed by depositing a layer of spacer material, e.g., silicon nitride, and thereafter performing an anisotropic etching process on the layer of spacer material so as to result in the spacers 120 depicted in the FIG. 2D. The base thickness or width of the spacers 120 may vary depending upon the particular application. During the formation of the spacers 120, the sacrificial gate insulation layer 110 serves as an etch mask to protect the surface of the second layer of epi semiconductor material 106.

FIG. 2E depicts the device 100 after an etching process has been performed to remove exposed portions of the sacrificial gate insulation layer 110. The etching process is performed for a sufficient duration to insure that the upper surface 106S of the second layer of epi semiconductor material 106 is cleared of oxide material in the areas laterally outside of the spacers 120, i.e., the source/drain regions 122. As a result of this process, the portions of the patterned hard mask layer 108 that are positioned above the source/drain regions 122 of the device are removed. However, as indicted in dashed lines in the plan view shown in FIG. 2E, portions 108E of the patterned hard mask layer 108 remain positioned under the sidewall spacers 120 and the sacrificial gate structure 118.

As will be appreciated by those skilled in the art after a complete reading of the present application, the novel methods disclosed herein present the device manufacturer with several options as it relates to the formation of the source/drain regions 122. For example, at the point of processing depicted in FIG. 2F, traditional ion implantation processes may be performed to define the source/drain regions in the exposed portions of the second layer of epi semiconductor material 106. Additionally, using one embodiment of the various methods disclosed herein, the problems traditionally encountered when trying to form epi semiconductor material on fins that are defined in the source/drain region may be avoided.

However, if desired, additional processing operations may be performed to form additional epi semiconductor material 124 in the source/drain regions 122 as will be described with reference to FIGS. 2F-G. More specifically, FIG. 2F depicts the device 100 after one or more etching processes have been performed to remove exposed portions of the epi semiconductor material 104 and the epi semiconductor material 106 that are positioned laterally outside of the spacers 120. This etching process sequence is performed to insure that the upper surface 102S of the substrate 102 is cleared of the epi semiconductor material 104 and all foreign materials, such as oxide material, in the areas laterally outside of the spacers 120, i.e., the source/drain regions 122. Thereafter, the epi semiconductor material 124 may be formed on the substrate 102 in the source/drain regions 122 of the device 100.

Figure 2H:
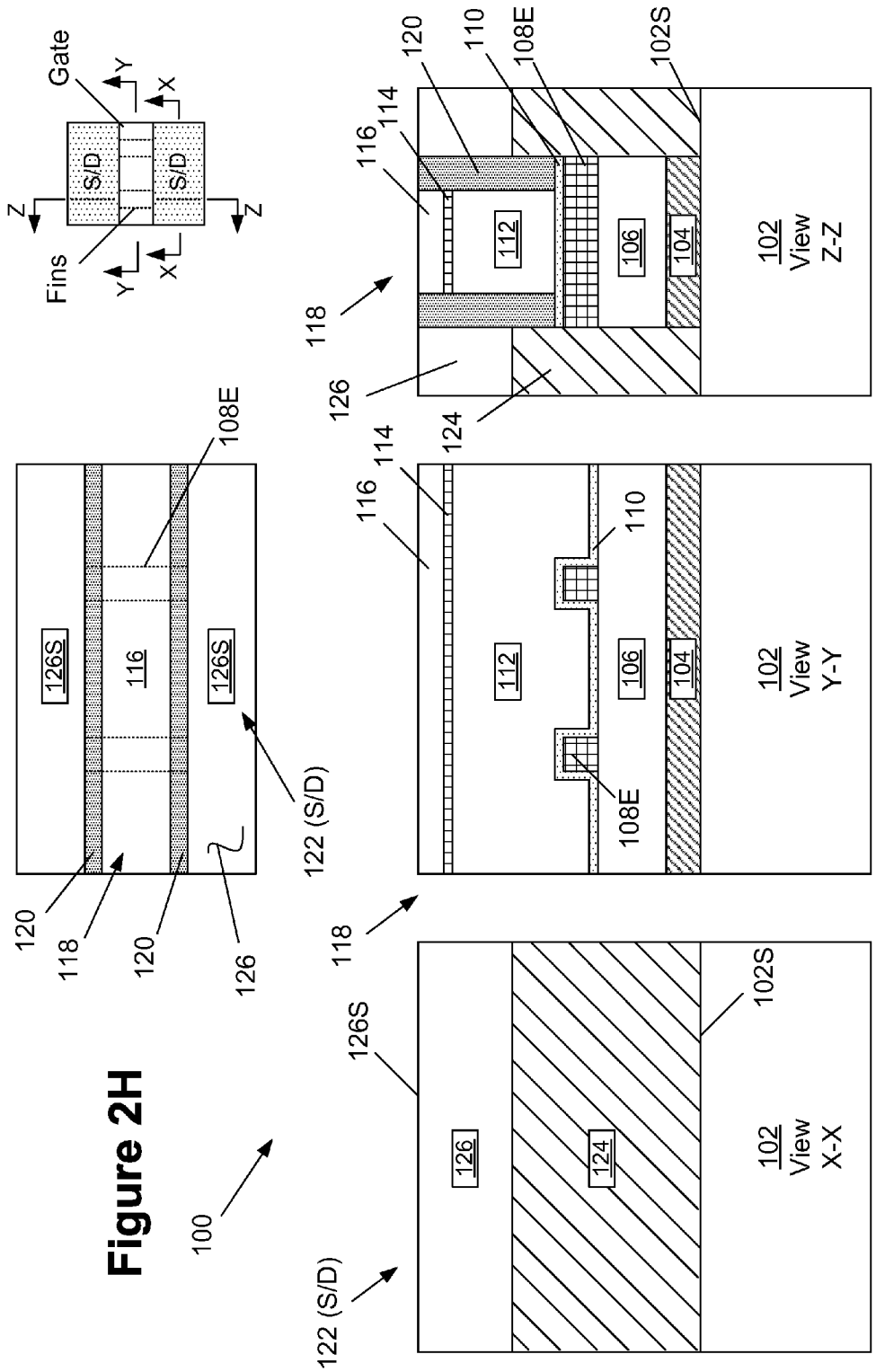

FIG. 2H depicts the device 100 after a layer of insulating material 126 was deposited above the device 100 and after a CMP process was then performed to planarize the upper surface of the layer of insulating material 126 with the upper surface of the gate cap layer 116. The layer of insulating material 126 may be comprised of, for example, silicon dioxide, and it may be formed by performing a CVD process.

Figure 2I:
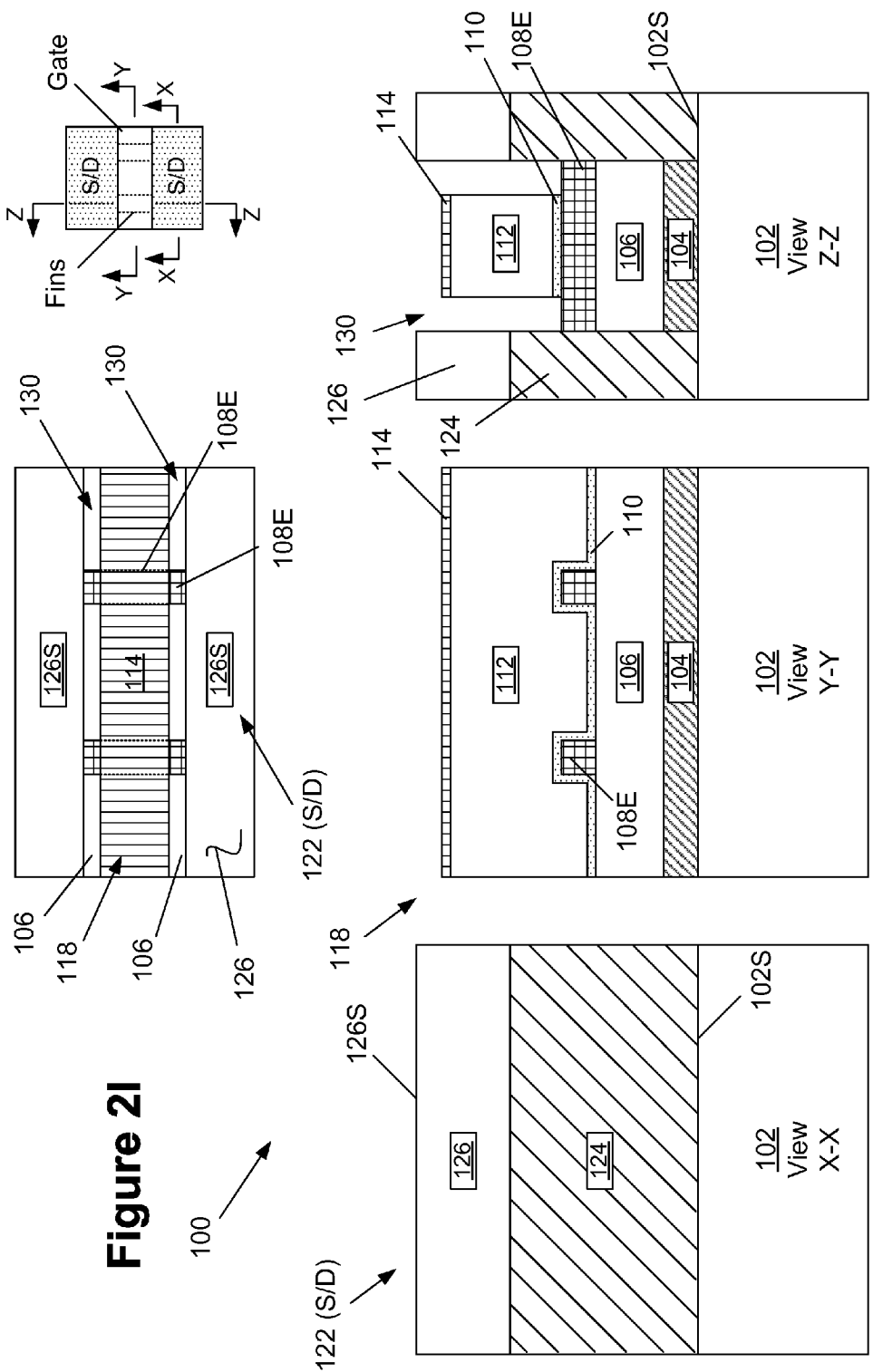
Figure 2I:
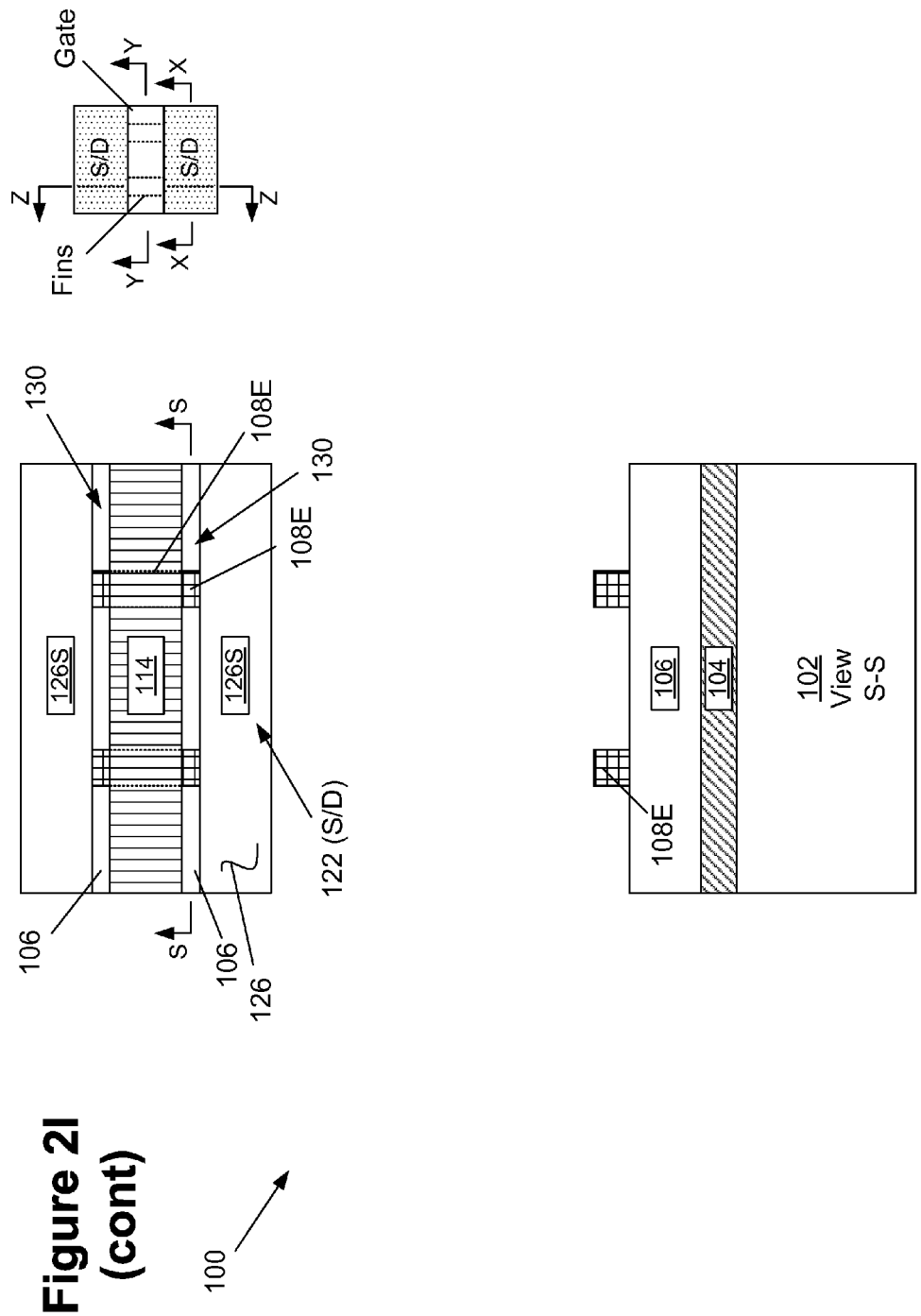

FIG. 2I depicts the device 100 after several process operations were performed. More specifically, one or more etching processes were performed to remove the gate cap 116 and the sidewalls spacers 120. This etching sequence results in the formation of a spacer cavity 130 that exposes the upper surface of the layer of insulating material 114 and some of the remaining portions 108E of the patterned hard mask layer 108. However, portions 108E of the patterned hard mask layer 108 remain positioned under the sidewall spacers 120 and the sacrificial gate structure 118. Additionally, as indicted in the plan view shown in FIG. 2I, the formation of the spacer cavity 130 also exposes the portions of the upper surface of the epi semiconductor material 106 that are not covered by the portions 108E of the patterned hard mask layer 108. FIG. 2I also includes a new cross-sectional view "S-S" that is taken through the spacer cavity 130 in the gate-width direction of the device 100.

Figure 2J:
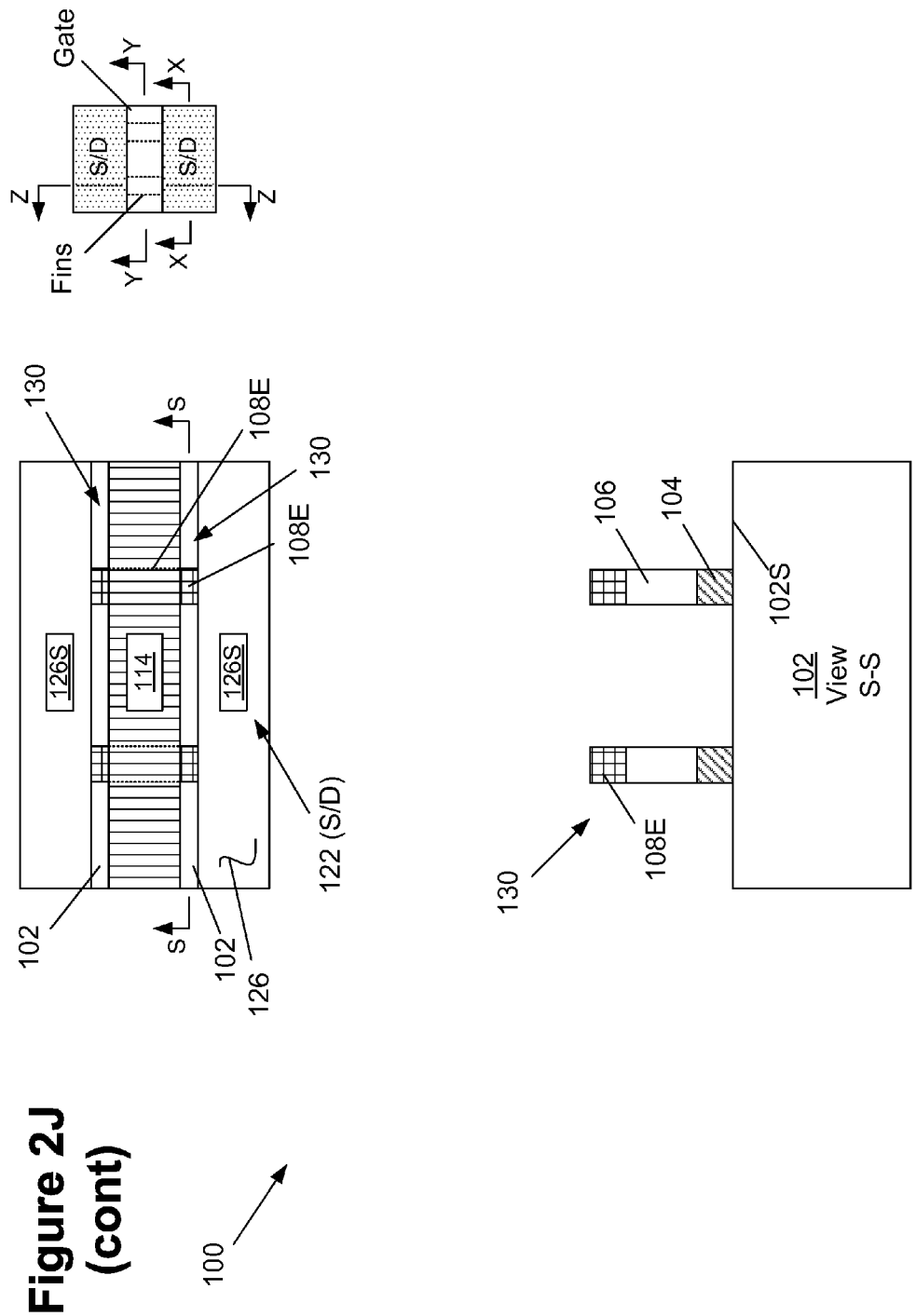

FIG. 2J depicts the device 100 after one or more etching processes have been performed through the spacer cavity 130 to remove exposed portions of the epi semiconductor materials 104 and 106 in the area under the spacer cavity 130, selective to materials 114 and 108E. This etching process may be a conventional dry plasma etch process. In one illustrative process flow, as shown in view "S-S", this results in the definition of fin structures in the area under the remaining portions 108E within the space defined by the spacer cavity 130. As depicted in this example, the fin structure is comprised of the epi material 106 stacked on top of the epi material 104.

Figure 2K:
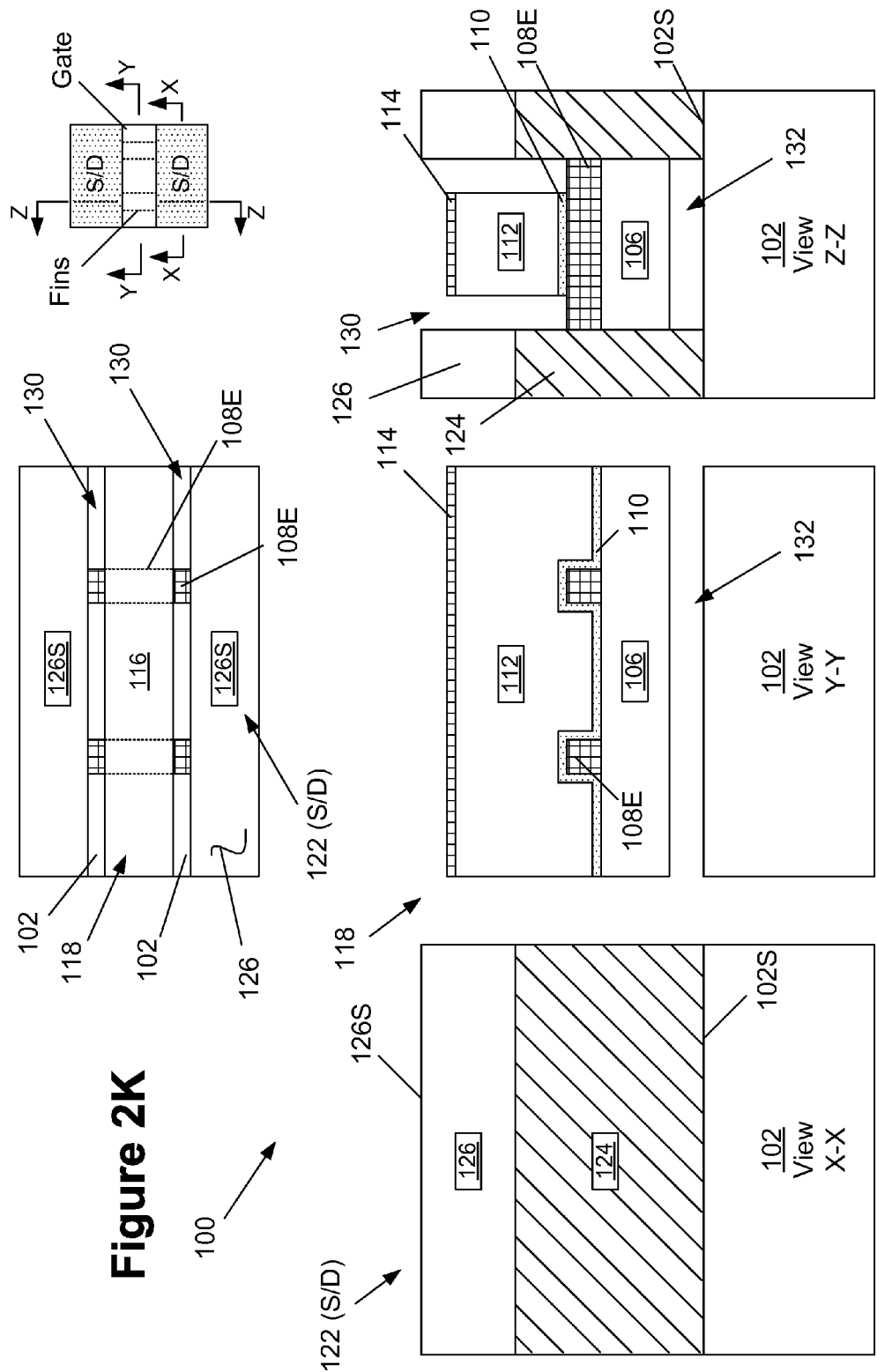
Figure 2K:
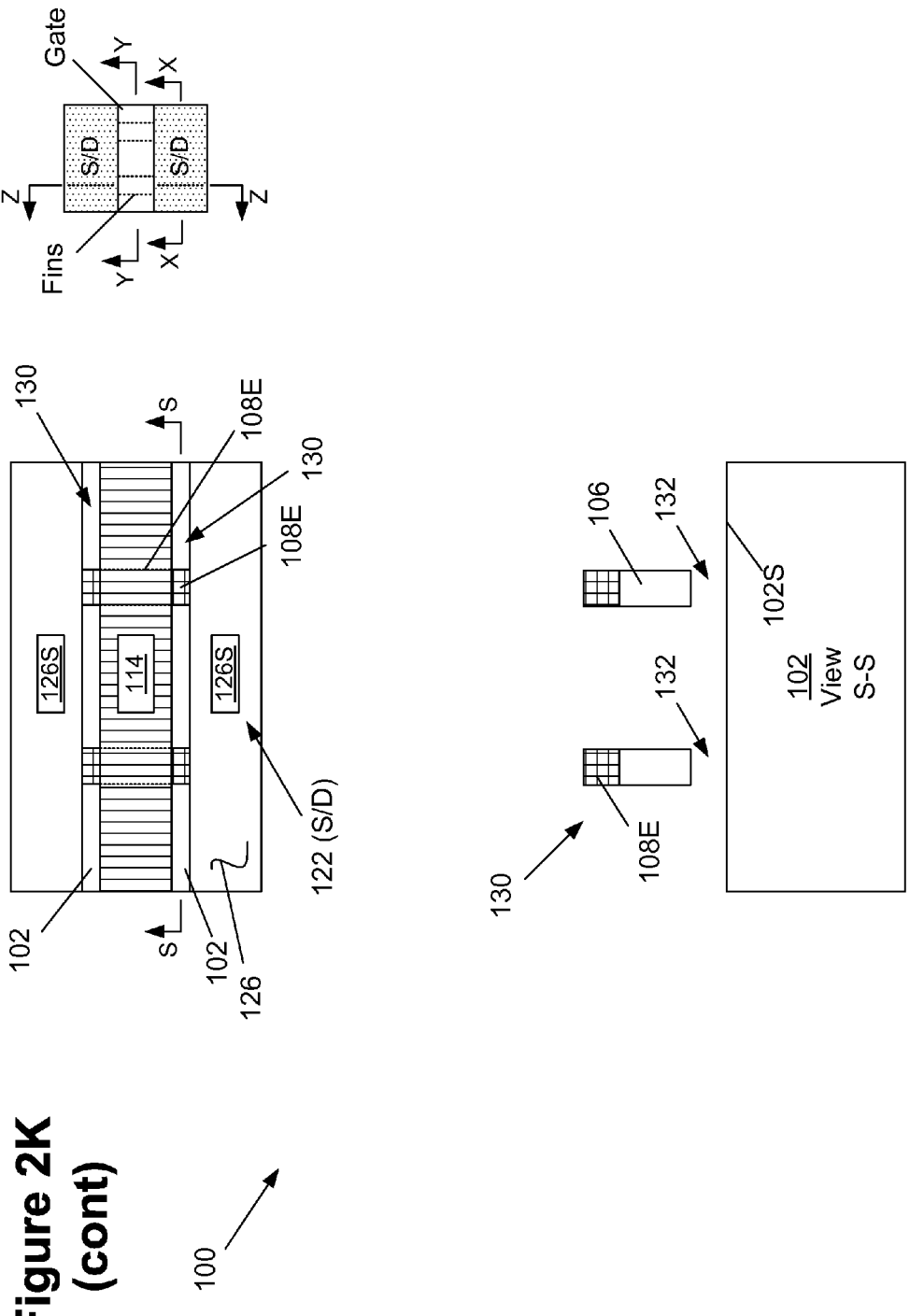

As an optional process flow, FIG. 2K depicts the device 100 after an etching process has been performed through the spacer cavity 130 to remove exposed portions of the epi semiconductor material 104 selectively relative to the epi semiconductor material 106 and the substrate 102 in the area under the spacer cavity 130 and under the epi material 106. This etching process is an isotropic etching process. In one illustrative process flow, as shown in views "Y-Y, "Z-Z and "S-S", this results in the definition of open areas or spaces 132 that were formerly occupied by the epi material 104. As will be appreciated by those skilled in the art after a complete reading of the present application, in one embodiment, the material of the epi semiconductor material 104 is selected such that it may be selectively etched relative to the epi semiconductor material 106 and the substrate 102.

FIG. 2L depicts the device 100 after an etching process was performed to remove the layer of insulating material 114. This process exposes the upper surface of the sacrificial gate electrode 112.

FIG. 2M depicts the device 100 after several process operations were performed. First, the spaces 132 and the spacer cavity 130 were substantially filled with an insulating material 134, such as silicon nitride, a low-k (k value less than 3.8) insulating material, etc., as shown in views "Y-Y, "Z-Z and "S-S". The insulating material 134 may be formed by performing an ALD deposition process. Thereafter, an isotropic etch back process was performed to form a recess 135 above the sacrificial gate structure 118. FIG. 2M also includes a new cross-sectional view "T-T" that is taken across the gate structure in a gate-length direction of the device 100 at a location where the remaining portion 108E of the patterned hard mask 108 is not present. As can be seen in the view "T-T", in one embodiment, the insulating material 134 has a substantially "U" shaped configuration that defines an opening 137 in which the sacrificial gate structure 118, i.e., the sacrificial gate insulation layer 110 and the sacrificial gate electrode 124, is positioned.

Figure 2N:
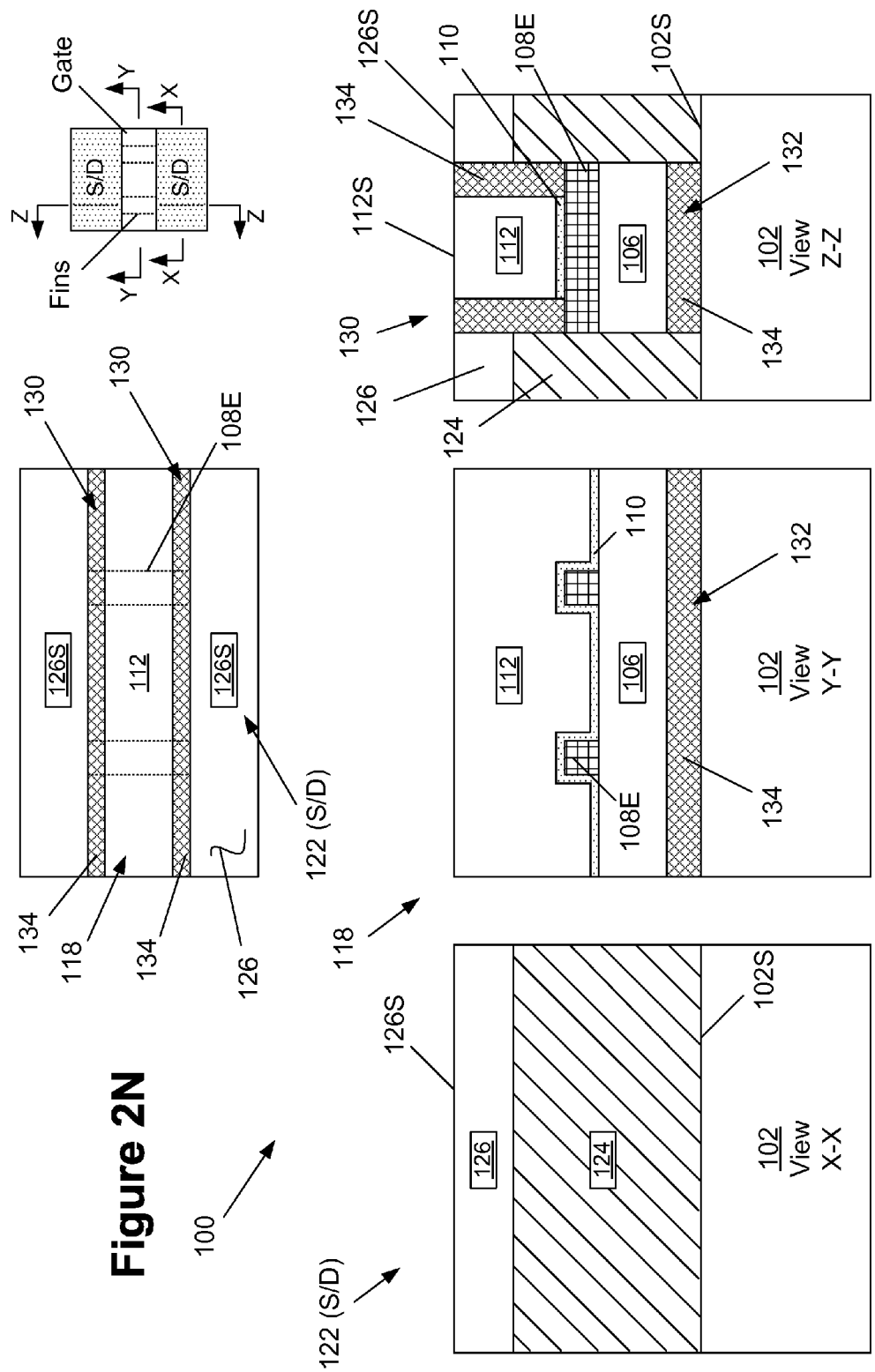

FIG. 2N depicts the device after a CMP process was performed on the layer of insulating material 126 that stops on the upper surface 112S of the sacrificial gate electrode 112. That is, an upper surface 126S of the layer of insulating material 126 is substantially planar with the upper surface 112S of the sacrificial gate electrode 112.

The next major process operation involves removing the sacrificial gate structure 118. Accordingly, FIG. 2O depicts the device 100 after one or more wet or dry etching processes were performed to remove the sacrificial gate electrode 112 and the sacrificial gate insulation layer 110 to thereby define a gate cavity 140 where a replacement gate structure will subsequently be formed for the device 100. Typically, the sacrificial gate insulation layer 110 is removed as part of the replacement gate technique, as depicted herein. However, the sacrificial gate insulation layer 110 may not be removed in all applications. Even in cases where the sacrificial gate insulation layer 110 is intentionally removed, there will typically be a very thin native oxide layer (not shown) that forms on the surface of the epi semiconductor material 106 that is exposed within the gate cavity 140

Figure 2P:
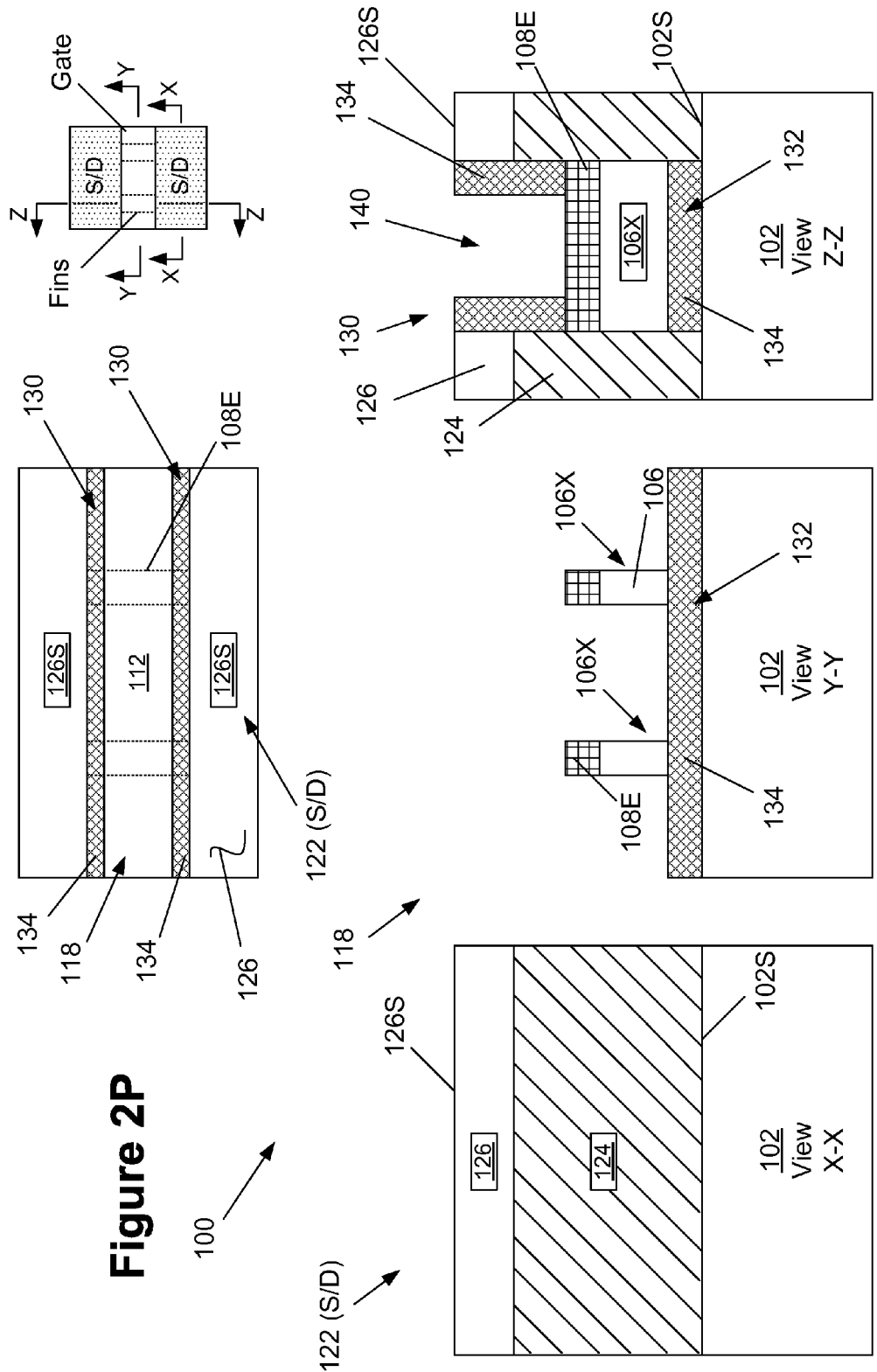

As shown in FIG. 2P, the next major process operation involves performing an etching process through the gate cavity 140 to form two illustrative fin structures 106X for the device 100 within the channel region of the device using the remaining portions 108E of the patterned hard mask 108 as an etch mask. During this etching process, the insulating material 134 acts as an etch-stop layer. In some applications, a further etching process may be performed to reduce the width or to "thin" the fins, although such a thinning process is not depicted in the attached drawings. For purposes of this disclosure and the claims, the use of the terms "fin" or "fins" should be understood to refer to fins that have not been thinned as well as fins that have been subjected to such a thinning etch process. The overall size, shape and configuration of the fins 106X may vary depending on the particular application. In the example depicted herein, the fins 106X are formed by performing an anisotropic etching process that results in the fins 106X having a schematically depicted, generally rectangular configuration. In an actual real-world device, the sidewalls of the fins 106X may be somewhat tapered, although that configuration is not depicted in the drawings. Thus, the size and configuration of the fins 106X, and the manner in which they are made, should not be considered a limitation of the present invention. For ease of disclosure, only the substantially rectangular fins 106X will be depicted in subsequent drawings.

As an optional process flow, FIG. 2Q depicts the device 100 after an etching process has been performed through the gate cavity 140 to remove the exposed portions of the remaining portions 108E of the patterned hard mask 108. This etching process may be performed if it is desired to form a tri-gate FinFET device 100. If the remaining portions 108E of the patterned hard mask 108 are not removed, then the device is a dual-gate FinFET device. This etching process may be an isotropic or an anisotropic etching process.

Figure 2R:
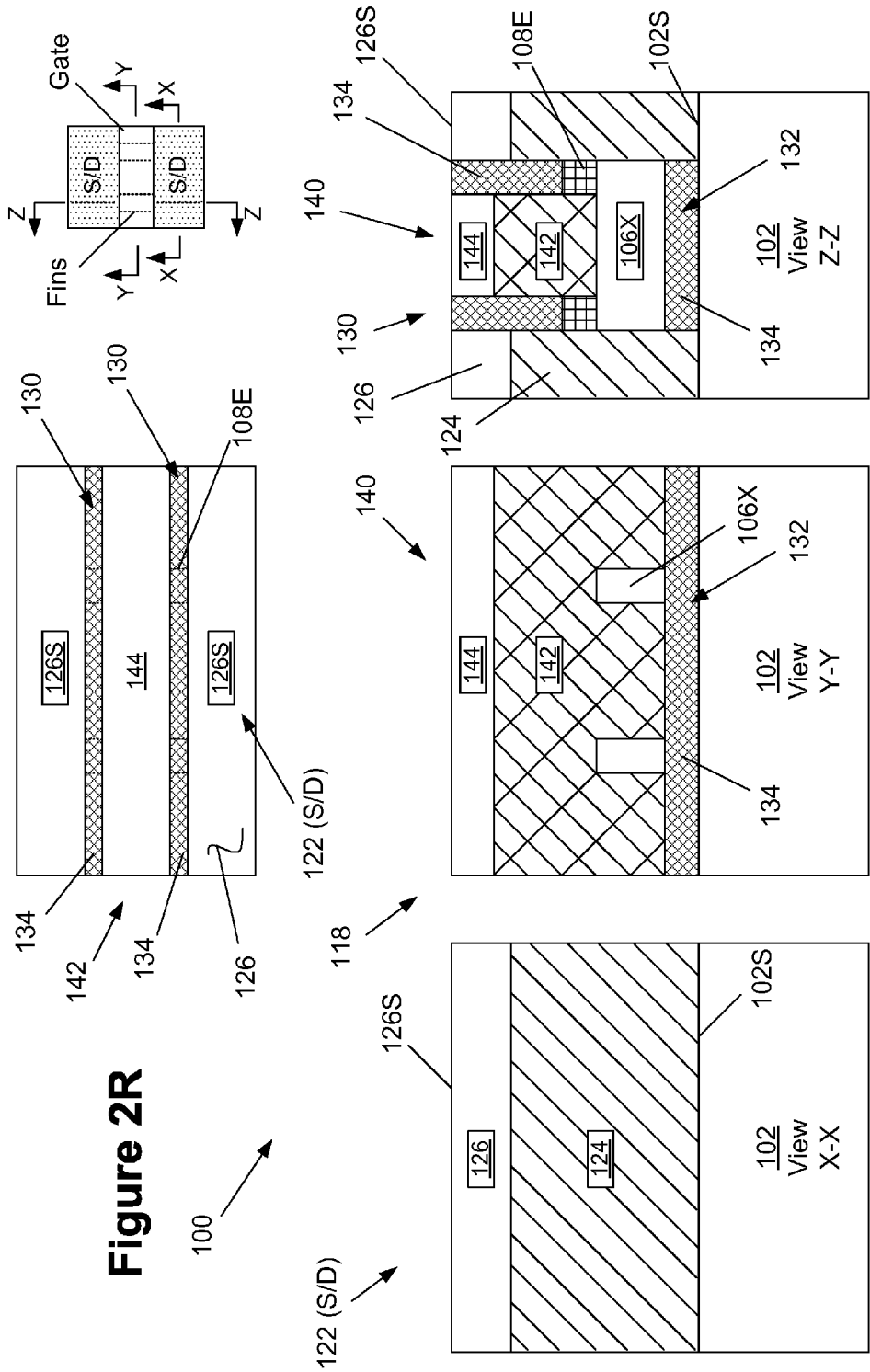

FIG. 2R depicts the device after several process operations were performed. First, several known processing operations were performed to form a schematically depicted replacement gate structure 142 in the gate cavity 140. The replacement gate structure 142 depicted herein is intended to be representative in nature of any type of gate structure that may be employed in manufacturing integrated circuit products using so-called gate-last (replacement gate) manufacturing techniques. The replacement gate structure 142 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum. Typically, the various layers of material that will be present in the replacement gate structure 142 are sequentially deposited in the gate cavity 140 and one or more CMP processes are performed to remove excess portions of the gate materials positioned outside of the gate cavity 140, as described in the background section of this application. Then, one or more etching processes were performed to remove upper portions of the various materials within the cavity 140 so as to form the replacement gate structure 142 and to form a recess above the replacement gate structure 142. Then, a gate cap 144 was formed in the recess above the recessed gate materials. The gate cap 144 is typically comprised of silicon nitride and it may be formed by depositing a layer of gate cap material so as to over-fill the recess formed in the gate cavity 140 above the replacement gate structure 142 and thereafter performing a CMP process to remove excess portions of the gate cap material layer positioned above the surface of the layer of insulating material 126. The gate cap 144 is formed so as to protect the underlying gate materials during subsequent processing operations.

Figure 2S:
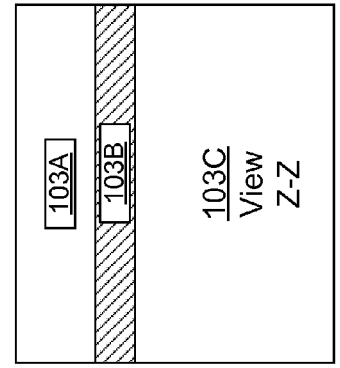
Figure 2S:
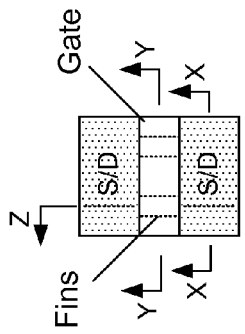
Figure 2S:
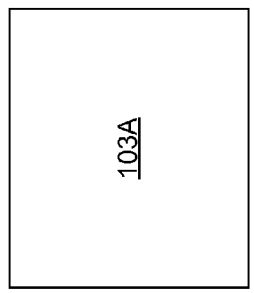
Figure 2S:
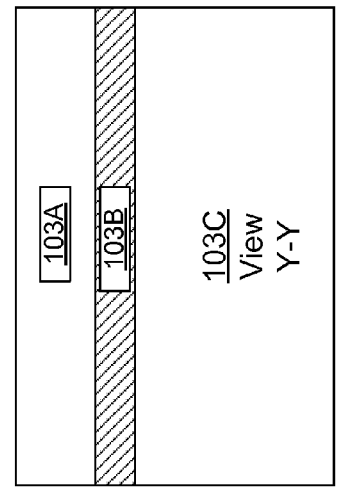
Figure 2T:
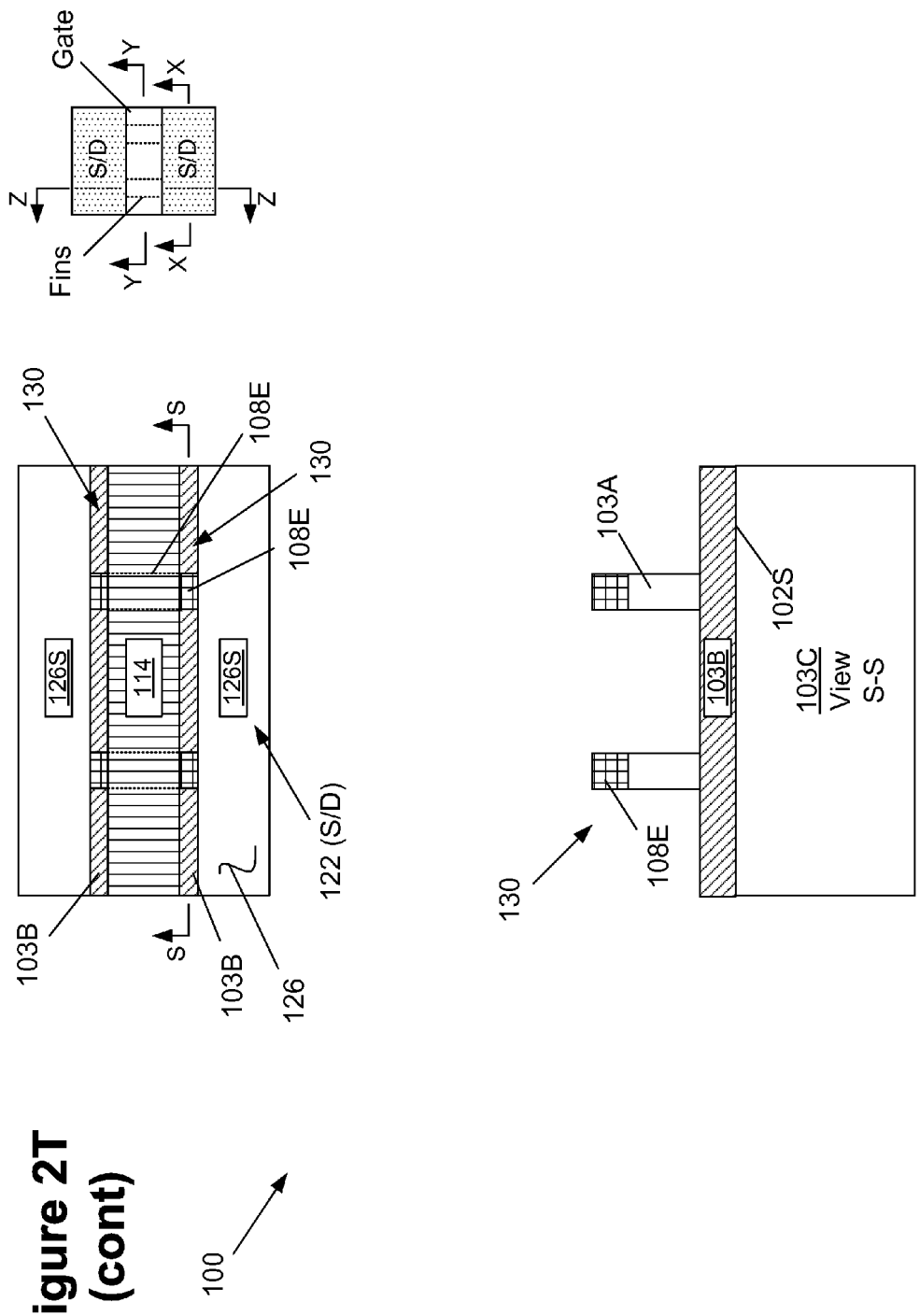

FIGS. 2S-2U represent an alternative embodiment wherein the device disclosed herein may be manufactured on a so-called silicon-on-insulator (SOI) substrate 103. As shown in FIG. 2S, the SOI substrate 103 is generally comprised of an active layer 103A (where devices are formed), a buried insulation layer 103B (sometimes referred to as a "box" layer) and a bulk semiconductor layer 103C. FIG. 2T corresponds to a point in the process flow that is depicted in FIG. 2I, i.e., the spacer cavity 130 has been formed by removing the spacers 120. FIG. 2U corresponds to a point in the process flow depicted in FIG. 2R. In this alternative flow, the fin structure 106X is defined in the active layer 103A of the SOI substrate 103. Due to the presence of the buried insulation layer 103B, the above-described steps of removing the epi semiconductor material 104 so as to form the spaces 132 under the epi material 106 and thereafter forming the layer of insulating material 134 to fill those spaces may be omitted. The insulating material 134 is still formed to fill the spacer cavities 130 adjacent the gate structure.

As will be appreciated by those skilled in the art after a complete reading of the present application, the FinFET device 100 depicted herein has a unique structure and provides unique benefits relative to prior art FinFET devices. More specifically, positioning of the local, substantially self-aligned channel isolation material 134 under all or a substantial portion of the channel region of the device 100 may result in better electrical performance of the device 100, e.g., the reduction or elimination of undesirable punch through currents. As noted above, in one embodiment, the substantially self-aligned channel isolation material 134 has a lateral width (in the current transport direction) that is wider than the width of the replacement gate structure 142 and the channel region of the device 100. Moreover, using the novel process flow depicted herein, the epi semiconductor material 104 may still remain positioned between the substrate 102 and the epi semiconductor material 106 in the channel region of the device (see view Z-Z in FIG. 2N). Of course, if desired, a process flow may be adopted in which the epi semiconductor material 104 positioned outside of the spacers 120 is substantially consumed or replaced, e.g., by forming inverted or embedded source/drain regions for the device 100 using well known techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method of forming a FinFET device, comprising:
   forming a patterned hard mask above a layer of semiconductor material, said patterned hard mask having a pattern corresponding to a fin structure to be formed in said layer of semiconductor material;

forming a sacrificial gate structure above said patterned hard mask and said layer of semiconductor material;

after forming said sacrificial gate structure, forming a first sidewall spacer adjacent said sacrificial gate structure;

forming a layer of insulating material adjacent said first sidewall spacer;

performing at least one first etching process to remove said first sidewall spacer and thereby define a spacer cavity between said layer of insulating material and said sacrificial gate structure;

substantially filling at least said spacer cavity with an insulating material so as to define at least second sidewall spacers in said spacer cavity;

performing at least one second etching process to remove said sacrificial gate structure and thereby define a replacement gate cavity positioned between said second sidewall spacers;

performing at least one etching process through said replacement gate cavity to define said fin structure in said layer of semiconductor material using said patterned hard mask exposed within said replacement gate cavity as an etch mask; and forming a replacement gate structure in said replacement gate cavity around at least a portion of said fin structure.

2. The method of claim 1, wherein said semiconductor material is an active layer of an SOI substrate.

3. The method of claim 1, wherein said semiconductor material is a layer of silicon that is formed on a layer of is silicon/germanium ($Si_xGe_{1-x}$).

4. The method of claim 1, wherein said replacement gate structure comprises a gate insulation layer comprised of a high-k insulating material and a gate electrode comprised of at least one layer of metal.

5. The method of claim 1, wherein substantially filling at least said spacer cavity with an insulating material comprises performing an atomic layer deposition process to substantially fill at least said spacer cavity with an insulating material with silicon nitride or a low-k insulating material followed by performing an isotropic etch-back etching process on said insulating material.

6. A method of forming a FinFET device, comprising:

forming a first layer of epi semiconductor material on a semiconductor substrate;

forming a second layer of epi semiconductor material on said first layer of epi semiconductor material, said first layer of epi semiconductor material being selectively etchable relative to said substrate and said second layer of epi semiconductor material;

forming a patterned hard mask above said second layer of epi semiconductor material, said patterned hard mask having a pattern corresponding to a fin structure to be formed in said second layer of epi semiconductor material;

forming a sacrificial gate structure above said patterned hard mask and said second layer of epi semiconductor material;

after forming said sacrificial gate structure, forming a first sidewall spacer adjacent said sacrificial gate structure;

forming a layer of insulating material adjacent said first sidewall spacer;

performing at least one first etching process to remove said first sidewall spacer and thereby define a spacer cavity between said layer of insulating material and said sacrificial gate structure so as to expose an upper surface of said second layer of epi semiconductor material;

performing at least one second etching process through said spacer cavity so as to remove at least portions of said first layer of epi semiconductor material in the area below said spacer cavity and a space that is positioned vertically between said substrate and said second layer of epi semiconductor material;

substantially filling at least said spacer cavity and said space so at to define at least second sidewall spacers in said spacer cavity;

performing at least one third etching process to remove said sacrificial gate structure and thereby define a replacement gate cavity positioned between said second sidewall spacers;

performing at least one fourth etching process through said replacement gate cavity to define said fin structure in said second layer of epi semiconductor material using said patterned hard mask exposed within said replacement gate cavity as an etch mask; and forming a replacement gate structure in said replacement gate cavity around at least a portion of said fin structure.

7. The method of claim 6, wherein said substrate is silicon, said first layer of epi semiconductor material is silicon/germanium ($Si_xGe_{1-x}$) and said second layer of epi semiconductor material is silicon.

8. The method of claim 6, wherein said replacement gate structure comprises a gate insulation layer comprised of a high-k insulating material and a gate electrode comprised of at least one layer of metal.

9. The method of claim 6, wherein substantially filling at least said spacer cavity and said space between said second layer of epi semiconductor material and said substrate comprises performing an atomic layer deposition process to substantially fill at least said spacer cavity and said space between said second layer of epi semiconductor material and said substrate with an insulating material that is made of silicon nitride or a low-k insulating material followed by performing an isotropic etch-back etching process on the insulating material.

* * * * *

UNITED STATES PATENT AND TRADEMARK OFFICE
CERTIFICATE OF CORRECTION

Page 1 of 3

PATENT NO. : 9,059,042 B2
APPLICATION NO. : 14/078979
DATED : June 16, 2015
INVENTOR(S) : Ruilong Xie and Ajey Poovannummoottil Jacob It is certified that error appears in the above-identified patent and that said Letters Patent is hereby corrected as shown below:

Delete Title page, and replace with new Title page. (attached)

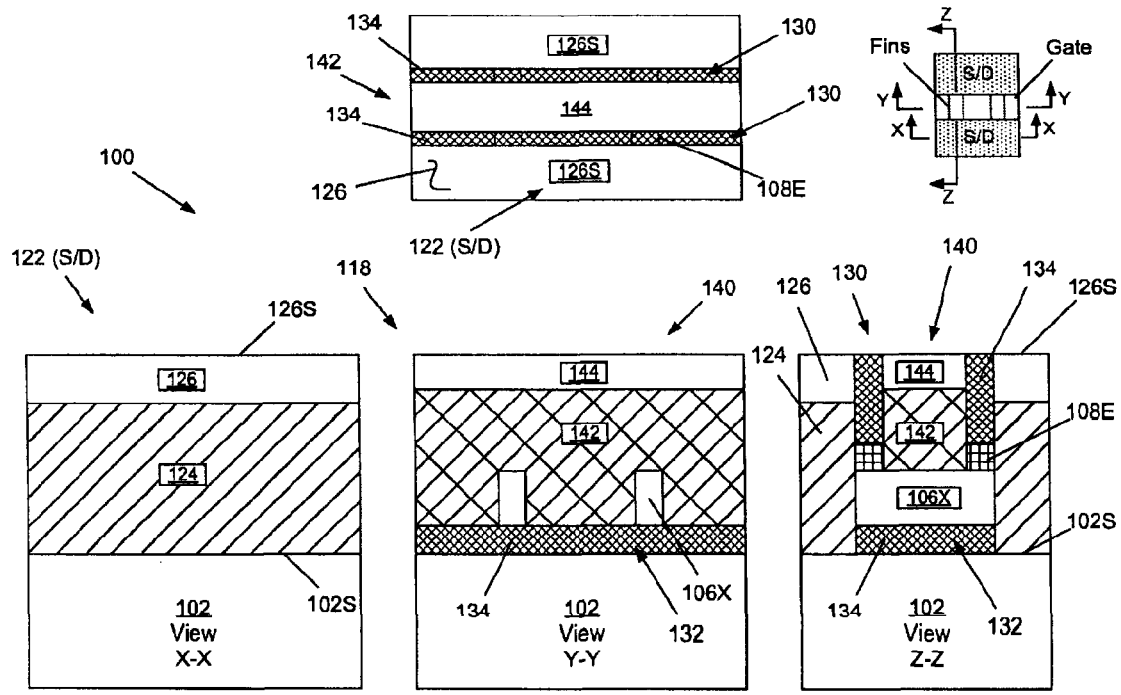

Claims

Col. 14, after line 51 (after claim 9), please insert the following claims:

--10. A method of forming a FinFET device above an SOI substrate comprised of a bulk semiconductor substrate, a buried insulation layer positioned above the bulk substrate and an active layer comprised of a semiconductor material positioned above the buried insulation layer, wherein the method comprises:

forming a patterned hard mask above said active layer of said SOI substrate, said patterned hard mask having a pattern corresponding to a fin structure to be formed in said active layer;

forming a sacrificial gate structure above said patterned hard mask and said active layer;

after forming said sacrificial gate structure, forming a first sidewall spacer adjacent said sacrificial gate structure;

forming a layer of insulating material adjacent said first sidewall spacer;

performing at least one first etching process to remove said first sidewall spacer and thereby define a spacer cavity between said layer of insulating material and said sacrificial gate structure so as to expose an upper surface of said active layer;

Signed and Sealed this
Twenty-ninth Day of March, 2016

Michelle K. Lee
*Director of the United States Patent and Trademark Office*

Claims performing at least one second etching process through said spacer cavity so as to remove at least portions of said active layer in the area below said spacer cavity while using said buried insulation layer as an etch stop layer;

substantially filling at least said spacer cavity so as to define at least second sidewall spacers in said spacer cavity;

performing at least one third etching process to remove said sacrificial gate structure and thereby define a replacement gate cavity positioned between said second sidewall spacers;

performing at least one fourth etching process through said replacement gate cavity to define said fin structure in said active layer using said patterned hard mask exposed within said gate cavity as an etch mask, said at least one fourth etching process being performed using said buried insulation layer as an etch stop layer; and forming a replacement gate structure in said replacement gate cavity around at least a portion of said fin structure.

11. The method of claim 10, wherein said active layer is comprised of silicon, said buried insulation layer is comprised of silicon dioxide and said bulk substrate is comprised of silicon.

12. The method of claim 10, wherein substantially filling at least said spacer cavity so as to define at least second sidewall spacers in said spacer cavity comprises performing an atomic layer deposition process with an insulating material that is made of silicon nitride or a low-k insulating material.--

CERTIFICATE OF CORRECTION (continued)

(12) United States Patent
Xie et al.

(10) Patent No.: US 9,059,042 B2
(45) Date of Patent: Jun. 16, 2015

(54) METHODS OF FORMING REPLACEMENT GATE STRUCTURES AND FINS ON FINFET DEVICES AND THE RESULTING DEVICES

(71) Applicant: GLOBALFOUNDRIES Inc., Grand Cayman (KY)

(72) Inventors: Ruilong Xie, Niskayuna, NY (US); Ajey Poovannummoottil Jacob, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/078,979

(22) Filed: Nov. 13, 2013

(65) Prior Publication Data

US 2015/0129962 A1      May 14, 2015

(51) Int. Cl.
| | |
|---|---|
| H01L 21/84 | (2006.01) |
| H01L 27/12 | (2006.01) |
| H01L 29/66 | (2006.01) |
| H01L 29/423 | (2006.01) |
| H01L 27/092 | (2006.01) |

(52) U.S. Cl.
CPC ...... *H01L 27/1211* (2013.01); *H01L 29/42372* (2013.01); *H01L 21/845* (2013.01); *H01L 29/66795* (2013.01); *H01L 29/66787* (2013.01); *H01L 27/0924* (2013.01)

(58) Field of Classification Search
CPC ............ H01L 21/845; H01L 27/1211; H01L 27/0924; H01L 29/66795; H01L 29/66787
See application file for complete search history.

(56) References Cited

U.S. PATENT DOCUMENTS

| | | | |
|---|---|---|---|
| 8,580,634 B1 * | 11/2013 | Xie et al. | 438/212 |
| 2014/0291760 A1 * | 10/2014 | Cheng et al. | 257/347 |
| 2014/0377917 A1 * | 12/2014 | He et al. | 438/157 |

* cited by examiner

*Primary Examiner* — Phat X Cao
(74) *Attorney, Agent, or Firm* — Amerson Law Firm, PLLC

(57) ABSTRACT

One method disclosed includes, among other things, removing a sacrificial gate structure to thereby define a replacement gate cavity, performing an etching process through the replacement gate cavity to define a fin structure in a layer of semiconductor material using a patterned hard mask exposed within the replacement gate cavity as an etch mask and forming a replacement gate structure in the replacement gate cavity around at least a portion of the fin structure.

12 Claims, 29 Drawing Sheets